US011943941B2

(12) United States Patent
Okumura et al.

(10) Patent No.: US 11,943,941 B2
(45) Date of Patent: Mar. 26, 2024

(54) FOUR-TERMINAL TANDEM SOLAR CELL

(71) Applicant: Panasonic Intellectual Property Management Co., Ltd., Osaka (JP)

(72) Inventors: Hiroko Okumura, Osaka (JP); Akio Matsushita, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 56 days.

(21) Appl. No.: 17/529,334

(22) Filed: Nov. 18, 2021

(65) Prior Publication Data

US 2022/0085226 A1 Mar. 17, 2022

Related U.S. Application Data

(63) Continuation of application No. PCT/JP2020/006323, filed on Feb. 18, 2020.

(30) Foreign Application Priority Data

Jun. 7, 2019 (JP) .................................. 2019-107149

(51) Int. Cl.
*H10K 30/57* (2023.01)
*H01L 31/0224* (2006.01)
*H01L 31/043* (2014.01)

(52) U.S. Cl.
CPC ..... *H10K 30/57* (2023.02); *H01L 31/022433* (2013.01); *H01L 31/043* (2014.12); *Y02E 10/549* (2013.01)

(58) Field of Classification Search
CPC .......... H01L 31/022433; H01L 31/043; H10K 30/57; H10K 30/80; H10K 30/84; H10K 30/85; H10K 30/86
See application file for complete search history.

(56) References Cited

U.S. PATENT DOCUMENTS

2008/0264478 A1* 10/2008 Ahn ..................... H01L 31/0392
136/255
2011/0017298 A1* 1/2011 Lee ...................... H10K 39/601
438/95

(Continued)

FOREIGN PATENT DOCUMENTS

| JP | 2014-224006 | 12/2014 |
| JP | 2018-093168 | 6/2018 |
| JP | 3220083 U | 2/2019 |

OTHER PUBLICATIONS

International Search Report of PCT application No. PCT/JP2020/006323 dated Mar. 31, 2020.

(Continued)

*Primary Examiner* — Golam Mowla
(74) *Attorney, Agent, or Firm* — GREENBLUM & BERNSTEIN, P.L.C.

(57) ABSTRACT

The solar cell of the present disclosure includes: a first substrate having light-transmitting properties; a second substrate having light-transmitting properties; a third substrate disposed such that the second substrate is located between the first and third substrates; a first photoelectric conversion layer disposed between the first substrate and the second substrate and containing a perovskite material; a second photoelectric conversion layer disposed between the second substrate and the third substrate; and a pair of electrodes disposed so as to sandwich the first photoelectric conversion layer therebetween in a direction perpendicular to the arrangement direction of the first substrate, the second substrate, and the third substrate.

12 Claims, 11 Drawing Sheets

(56) References Cited

U.S. PATENT DOCUMENTS

| | | |
|---|---|---|
| 2016/0248028 A1 | 8/2016 | Huang et al. |
| 2018/0158976 A1 | 6/2018 | Ahn |
| 2018/0175112 A1* | 6/2018 | Robinson ............. H10K 30/151 |

OTHER PUBLICATIONS

Lukas Kranz et al., "High-Efficiency Polycrystalline Thin Film Tandem Solar Cells", The Journal of Physical Chemistry Letters, 6, Jun. 22, 2015, 2676-2681.

Takuya Orikoshi et al., "The effect of the number of layers on photocurrent in multilayered organic solar cells with through-layer electrodes", The 71st JSAP Autumn Meeting Abstracts of Japan Society of Applied Physics, 15a-R-6, Aug. 30, 2010, 12-122 (Whole Sentence Translation).

Shunjiro Fujii et al., "Semitransparent tandem organic solar cells using stacked structure", The 76th JSAP Autumn Meeting Abstracts of Japan Society of Applied Physics, 13p-PB9-12, Aug. 31, 2015, 11-130 (Whole Sentence Translation).

Olivier Dupre et al., "Field Performance versus Standard Test Condition Efficiency of Tandem Solar Cells and the Singular Case of Perovskites/Silicon Devices", The Journal of Physical Chemistry Letters, 9, Jan. 5, 2018, 446-458.

* cited by examiner

FOUR-TERMINAL TANDEM SOLAR CELL

BACKGROUND

1. Technical Field

The present disclosure relates to a four-terminal tandem solar cell.

2. Description of the Related Art

In recent years, active research and development is being conducted on perovskite solar cells that use, as a light absorption material, perovskite crystals having a composition formula of $ABX_3$ or a perovskite compound having a structure similar to the perovskite crystal structure. Here, A is a monovalent cation, and B is a divalent cation. X is a halogen anion.

It has been contemplated to use a tandem structure in order to increase the power generation efficiency of the perovskite solar cells.

K. Lukas et al., J. Phys. Chem. Lett., 2015, 6, 2676-2681 describes a solar cell having a tandem structure including a perovskite solar cell and a CIGS solar cell.

SUMMARY

A conventional four-terminal tandem solar cell requires three transparent electrodes. However, the use of the transparent electrodes causes a reduction in light transmittance and an increase in electrical resistance. This leads to a reduction in the power generation efficiency of the solar cell. There is therefore a need for a technique for avoiding the use of the transparent electrodes.

In one general aspect, the techniques disclosed here feature a solar cell including: a first substrate; a second substrate; a third substrate; a first photoelectric conversion layer; a second photoelectric conversion layer; and a pair of electrodes. The first substrate and the second substrate have light-transmitting properties, and the second substrate is disposed between the first substrate and the third substrate. The first photoelectric conversion layer is disposed between the first substrate and the second substrate, and the second photoelectric conversion layer is disposed between the second substrate and the third substrate. The pair of electrodes are disposed so as to sandwich the first photoelectric conversion layer therebetween in a direction perpendicular to an arrangement direction of the first substrate, the second substrate, and the third substrate.

According to the technique of the present disclosure, the use of transparent electrodes can be avoided.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

DETAILED DESCRIPTION

Figure 1A:
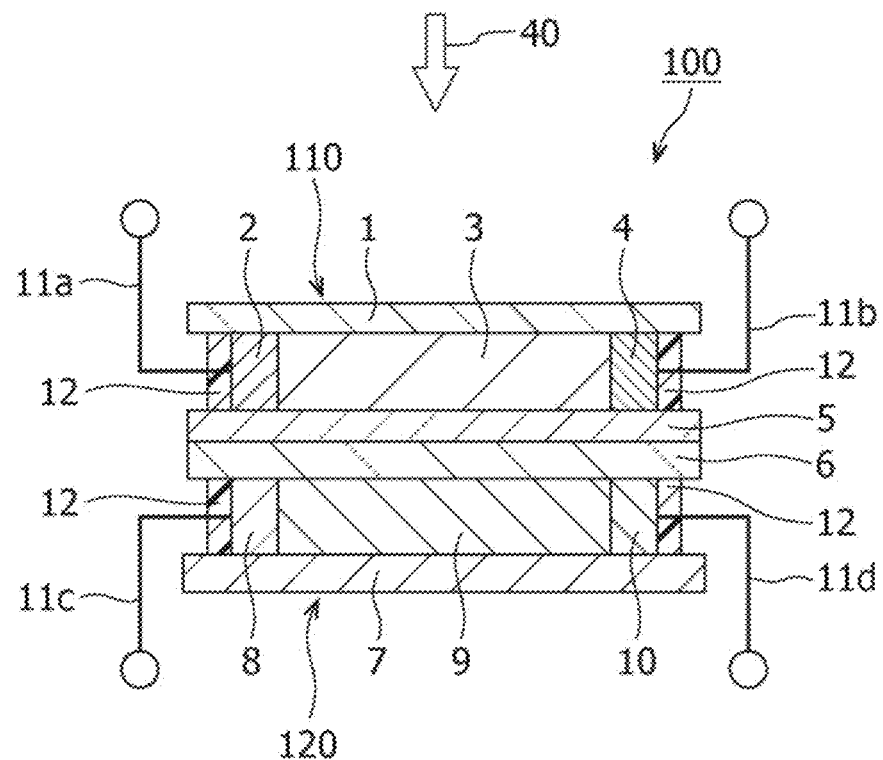
FIG. 1A is a cross-sectional view of a solar cell according to embodiment 1.

<Underlying Knowledge Forming Basis of the Present Disclosure>

Underlying knowledge forming the basis of the present disclosure is as follows.

Tandem solar cells include two-terminal tandem solar cells and four-terminal tandem solar cells. In a two-terminal tandem solar cell, a negative electrode of a top cell and an n-type semiconductor layer thereof are stacked on a p-type semiconductor layer of a bottom cell. Terminals are attached to a positive electrode of the bottom cell and a negative electrode of the top cell. In a four-terminal tandem solar cell, a bottom cell and a top cell have respective substrates. The top cell and the bottom cell are electrically insulated from each other. In the four-terminal tandem solar cell, terminals are connected to positive and negative electrodes of each cell, and a total of four terminals are provided.

The properties required for the four-terminal tandem solar cell that include the value of the band gap of the top cell, the value of the band gap of the bottom cell, and the theoretical efficiency of the four-terminal tandem solar cell are shown in "Alexis De Vos, J. Phys. D: Appl. Phys., 1980, 13, 839-846." When a light source used emits black body radiation, an efficiency of 40% to 42% is obtained when a silicon solar cell with a band gap of 1.1 eV is disposed as the bottom cell and a perovskite solar cell with a band gap of 1.9 eV is disposed as the top cell. A perovskite solar cell can be used also as the bottom cell. In this case, when the band gap of the perovskite solar cell is 1.0 eV, the maximum efficiency can be estimated to be 42.3%.

Japanese Patent No. 4953562 discloses a solar cell module including electrodes disposed on its front surface. The electrodes include front-side finger electrodes and busbar electrodes orthogonal to the front-side finger electrodes. It is stated that the front-side finger electrodes have a width equal to or more than 0.05 mm and equal to or less than 0.1 mm and that the busbar electrodes have a width equal to or more than 0.5 mm and equal to or less than 2 mm. It is also stated that three busbar electrodes are disposed on single crystal silicon having a side length of 100 mm to 150 mm.

Japanese Unexamined Patent Application Publication No. 2010-80887 discloses back-contact electrodes. The use of the back-contact electrodes allows the utilization of the power generation area to be maximized because the electrodes are disposed only on the back side.

"Qingfeng Dong et al., Science, 2015, 347, 6225, 967-970" reports a perovskite light absorption material with a carrier diffusion length of 175±25 μm.

In the conventional tandem solar cell structures, transparent electrodes are disposed on the light-receiving surfaces. The solar cell requires the transparent electrodes in order to allow light to pass through to photoelectric conversion layers. However, the use of the transparent electrodes causes a reduction in light transmittance and an increase in electrical resistance. This leads to a reduction in the power generation efficiency of the solar cell. The details of the reduction in the light transmittance will be described in "(Optical simulations of tandem solar cell having three transparent electrodes)" described later.

In view of the above findings, the inventors have found a structure of a four-terminal tandem solar cell that allows the use of transparent electrodes to be avoided.

SUMMARY OF ASPECTS OF PRESENT DISCLOSURE

A solar cell according to a first aspect of the present disclosure includes:
 a first substrate;
 a second substrate;
 a third substrate;
 a first photoelectric conversion layer;
 a second photoelectric conversion layer; and
 a pair of electrodes,
 wherein the first substrate and the second substrate have light-transmitting properties,
 wherein the second substrate is disposed between the first substrate and the third substrate,
 wherein the first photoelectric conversion layer is disposed between the first substrate and the second substrate,
 wherein the second photoelectric conversion layer is disposed between the second substrate and the third substrate, and
 wherein the pair of electrodes are disposed so as to sandwich the first photoelectric conversion layer therebetween in a direction perpendicular to an arrangement direction of the first substrate, the second substrate, and the third substrate.

In other words, the solar cell according to the first aspect of the present disclosure includes:
 the light-transmitting first substrate;
 the light-transmitting second substrate;
 the third substrate disposed such that the second substrate is disposed between the first substrate and the second substrate;
 the first photoelectric conversion layer disposed between the first substrate and the second substrate and containing a perovskite material;
 the second photoelectric conversion layer disposed between the second substrate and the third substrate; and
 the pair of electrodes disposed so as to sandwich the first photoelectric conversion layer therebetween in the direction perpendicular to the arrangement direction of the first substrate, the second substrate, and the third substrate.

In the first aspect, the use of the transparent electrodes can be avoided. When the electrodes are excluded from the light-receiving surfaces, incident light is not absorbed by the electrodes, so that the power generation efficiency of the solar cell can be improved. The "arrangement direction of the first substrate, the second substrate, and the third substrate" means the direction normal to the first substrate.

According to a second aspect of the present disclosure, in the solar cell according to the first aspect, for example, the pair of electrodes may include a first negative electrode and a first positive electrode. The solar cell may further include a first electron transport layer disposed between the first negative electrode and the first photoelectric conversion layer and a first hole transport layer disposed between the first positive electrode and the first photoelectric conversion layer. With this structure, the power generation efficiency of the solar cell can be improved.

According to a third aspect, in the solar cell according to the second aspect, for example, at least one selected from the group consisting of the first negative electrode and the first positive electrode may be a non-transparent electrode formed of a metal material. With this structure, the electrical resistance of the at least one of the electrodes can be reduced. Therefore, the power generation efficiency of the solar cell can be improved.

According to a fourth aspect of the present disclosure, the solar cell according to any one of the first to third aspects may further include, for example, an additional pair of electrodes disposed so as to sandwich the second photoelectric conversion layer therebetween in the direction perpendicular to the arrangement direction of the first substrate, the second substrate, and the third substrate. With this structure, the use of the transparent electrodes can be avoided. When the electrodes are excluded from the light-receiving surfaces, the power generation efficiency of the solar cell can also be improved.

According to a fifth aspect of the present disclosure, in the solar cell according to the fourth aspect, for example, the additional pair of electrodes may include a second negative electrode and a second positive electrode. The solar cell may further include a second electron transport layer disposed between the second negative electrode and the second photoelectric conversion layer and a second hole transport layer disposed between the second positive electrode and the second photoelectric conversion layer. With this structure, the power generation efficiency of the solar cell can be improved.

According to a sixth aspect of the present disclosure, in the solar cell according to the fifth aspect, for example, at least one selected from the group consisting of the second negative electrode and the second positive electrode may be a non-transparent electrode formed of a metal material. With this structure, the power generation efficiency of the solar cell can be improved.

According to a seventh aspect of the present disclosure, the solar cell according to any one of the first to third aspects may further include, for example, a second positive electrode having light-transmitting properties and disposed between the second substrate and the second photoelectric conversion layer and a second negative electrode disposed between the third substrate and the second photoelectric conversion layer. The second positive electrode may include a plurality of busbar electrodes and a plurality of finger electrodes, and the plurality of busbar electrodes may be electrically connected to each other through the plurality of finger electrodes. Although the positive electrodes are disposed on the light-receiving surface of the bottom cell, light is allowed to pass through to the photoelectric conversion layer efficiently.

According to an eighth aspect of the present disclosure, the solar cell according to any one of the first of third aspects may further include, for example, second negative electrodes disposed between the third substrate and the second photoelectric conversion layer and second positive electrodes disposed between the third substrate and the second photoelectric conversion layer. The second negative electrodes and the second positive electrodes may be arranged alternately in the direction perpendicular to the arrangement direction of the first substrate, the second substrate, and the third substrate and may be electrically insulated from each other with gaps therebetween. With this structure, the electric power generation area of the bottom cell can be increased.

According to a ninth aspect of the present disclosure, in the solar cell according to the second aspect, for example, the first electron transport layer and the first hole transport layer may be formed of respective inorganic materials.

According to a tenth aspect of the present disclosure, in the solar cell according to the fifth aspect, for example, the second electron transport layer and the second hole transport layer may be formed of respective inorganic materials.

In each of the ninth and tenth aspects, the photoelectric conversion layer is unlikely to be damaged during the production of the electron transport layer and the hole transport layer. Therefore, the tandem solar cell provided can have high thermal durability and high light durability.

According to an eleventh aspect of the present disclosure, in the solar cell according to any one of the first to tenth aspects, for example, the first photoelectric conversion layer may contain a perovskite material.

Embodiments of Present Disclosure

Embodiments of the present disclosure will be described with reference to the drawings. Solar cells shown in embodiments 1 to 10 are four-terminal tandem solar cells. The following embodiments are merely examples, and the present disclosure are not limited to the following embodiments.

Embodiment 1

[Overview of Solar Cell]

Figure 1B:
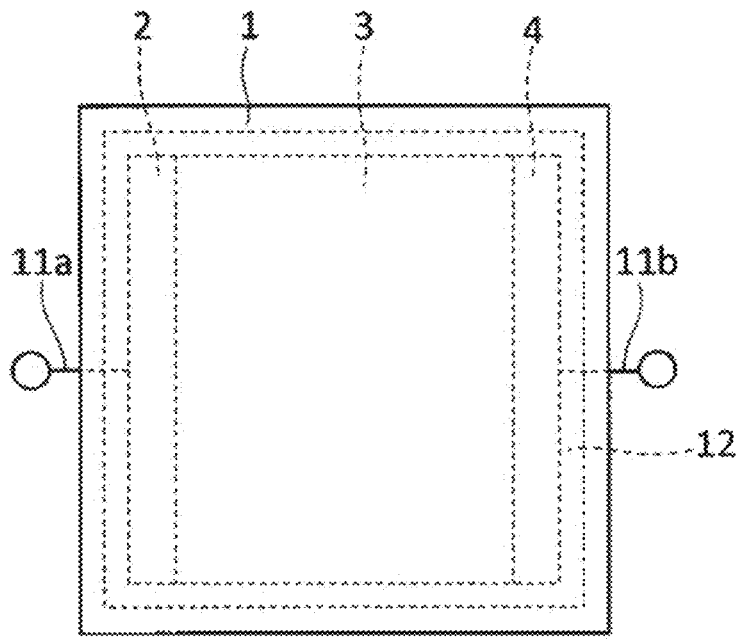
FIG. 1B is a top view of the solar cell according to embodiment 1.

FIG. 1A is a cross-sectional view of a solar cell 100 according to embodiment 1. FIG. 1B is a top view of the solar cell 100 according to embodiment 1.

The solar cell 100 includes a top cell 110 and a bottom cell 120. Light 40 is incident on the solar cell 100 from a prescribed direction. The top cell 110 is located on the light incident side. The bottom cell 120 is located downstream of the top cell 110 in the traveling direction of the light.

The top cell 110 includes a first substrate 1, a second substrate 5, and a first photoelectric conversion layer 3. The first photoelectric conversion layer 3 is disposed between the first substrate 1 and the second substrate 5. The first substrate 1, the first photoelectric conversion layer 3, and the second substrate 5 are arranged in this order. The plane of the first substrate 1 and the plane of the second substrate 5 are parallel to each other. The first photoelectric conversion layer 3 may or may not be in contact with each of the first substrate 1 and the second substrate 5.

The top cell 110 further includes a pair of electrodes 2 and 4. The pair of electrodes 2 and 4 are disposed so as to sandwich the first photoelectric conversion layer 3 therebetween in a direction perpendicular to the arrangement direction of the first substrate 1 and the second substrate 5. In other words, the pair of electrodes 2 and 4 are disposed so as to sandwich the first photoelectric conversion layer 3 therebetween in a direction perpendicular to the direction normal to the first substrate 1. The first photoelectric conversion layer 3 has two principal surfaces and at least one side surface. The pair of electrodes 2 and 4 are attached to the at least one side surface in a direction perpendicular to the thickness direction of the first photoelectric conversion layer 3. In the present embodiment, the first photoelectric conversion layer 3 has a rectangular shape in plan view and has four side surfaces. For example, when the first photoelectric conversion layer 3 has a circular shape, the number of side surfaces is 1. The "principal surfaces" mean the surfaces having the largest area. A "side surface" of the first photoelectric conversion layer 3 means its surface extending in a direction perpendicular to the arrangement direction of the first substrate 1 and the second substrate 5.

The pair of electrodes 2 and 4 include a first negative electrode 2 and a first positive electrode 4. In the present specification, "the first negative electrode 2, the first photoelectric conversion layer 3, and the first positive electrode 4" may be referred to as "top cell components."

The first negative electrode 2 has, for example, a rectangular shape in plan view. The first negative electrode 2 is attached to a side surface of the first photoelectric conversion layer 3. The first negative electrode 2 is disposed between the first substrate 1 and the second substrate 5. When the first substrate 1 and the first negative electrode 2 are projected onto a plane perpendicular to the thickness direction of the first photoelectric conversion layer 3, part or all of the projection image of the first negative electrode 2 is located inside the projection image of the first substrate 1. In this case, the first negative electrode 2 may or may not be in contact with each of the first substrate 1 and the second substrate 5. The first negative electrode 2 may be in contact with the first photoelectric conversion layer 3. More specifically, the first negative electrode 2 may be in contact with the entire side surface of the first photoelectric conversion layer 3. The first negative electrode 2 may be in contact with the first photoelectric conversion layer 3 only at its side surface. The first negative electrode 2 may be disposed, for example, between the first substrate 1 and the first photoelectric conversion layer 3. The first negative electrode may be disposed, for example, between the first photoelectric conversion layer 3 and the second substrate 5. With this structure, the top cell 110 produced can have high strength.

The first positive electrode 4 has, for example, a rectangular shape in plan view. The first positive electrode 4 is attached to a side surface of the first photoelectric conversion layer 3. The first positive electrode 4 is disposed between the first substrate 1 and the second substrate 5. When the first substrate 1 and the first positive electrode 4 are projected onto a plane perpendicular to the thickness direction of the first photoelectric conversion layer 3, part or all of the projection image of the first positive electrode 4 is located inside the projection image of the first substrate 1. In this case, the first positive electrode 4 may or may not be in contact with each of the first substrate 1 and the second substrate 5. The first positive electrode 4 may be in contact with the first photoelectric conversion layer 3. More specifically, the first positive electrode 4 may be in contact with the entire side surface of the first photoelectric conversion layer 3. The first positive electrode 4 may be in contact with the first photoelectric conversion layer 3 only at its side surface. The first positive electrode 4 may be disposed, for example, between the first substrate 1 and the first photoelectric conversion layer 3. The first positive electrode 4 may be disposed, for example, between the first photoelectric conversion layer 3 and the second substrate 5.

The first negative electrode 2 and the first positive electrode 4 face each other in the direction perpendicular to the arrangement direction of the first substrate 1 and the second substrate 5. The first negative electrode 2 and the first positive electrode 4 are attached to the first photoelectric conversion layer 3. Since the first negative electrode 2 and the first positive electrode 4 are positioned so as not to block the incident light, they do not need to be transparent electrodes. Specifically, with the structure of the present embodiment, the use of transparent electrodes can be avoided. However, the first negative electrode 2 and/or the first positive electrode 4 may be a transparent electrode.

In the present embodiment, the electrodes are positioned so as not to block the incident light. Therefore, the incident light is not absorbed by the electrodes, so that the solar cell 100 in the present embodiment has high photoelectric conversion efficiency.

The top cell 110 further includes terminals 11a and 11b. The terminal 11a is electrically connected to the first negative electrode 2. The terminal 11b is electrically connected to the first positive electrode 4.

The top cell 110 further includes a sealing portion 12. The sealing portion 12 surrounds the first negative electrode 2, the first photoelectric conversion layer 3, and the first positive electrode 4. The sealing portion 12 may be in contact with each of the first negative electrode 2, the first photoelectric conversion layer 3, and the first positive electrode 4. The sealing portion 12 may be in contact with each of the first substrate 1 and the second substrate 5. With the above structure, the top cell components can be isolated from the external environment. Therefore, deterioration of the solar cell due to intrusion of water or oxygen into the top cell components can be prevented.

The distance between the first negative electrode 2 and the first positive electrode 4 can be determined from the carrier diffusion length in the first photoelectric conversion layer 3. Since the first photoelectric conversion layer 3 contains a perovskite material, the carrier diffusion length in the first photoelectric conversion layer 3 is longer than that in a photoelectric conversion material used for conventional silicon solar cells. The carrier diffusion length in the photoelectric conversion layer containing the perovskite material is about 200 µm. The distance between the first negative electrode 2 and the first positive electrode 4 is set to be about 10 times the carrier diffusion length in the first photoelectric conversion layer 3. The distance between the first negative electrode 2 and the first positive electrode 4 is, for example, equal to or more than 0.2 mm and equal to or less than 2 mm.

The bottom cell 120 includes a second substrate 6, a third substrate 7, and a second photoelectric conversion layer 9. The third substrate 7 supports the first substrate 1, the second substrate 5, and the second substrate 6 in this order. The second substrates 5 and 6 are located between the third substrate 7 and the first substrate 1. The second photoelectric conversion layer 9 is disposed between the second substrate 6 and the third substrate 7. The second substrate 6, the second photoelectric conversion layer 9, and the third substrate 7 are disposed in this order. The plane of the second substrate 6 and the plane of the third substrate 7 are parallel to each other. The second photoelectric conversion layer 9 may or may not be in contact with each of the second substrate 6 and the third substrate 7.

The bottom cell 120 further includes a pair of electrodes 8 and 10. The pair of electrodes 8 and 10 are disposed so as to sandwich the second photoelectric conversion layer 9 therebetween in a direction perpendicular to the arrangement direction of the second substrate 6 and the third substrate 7. The second photoelectric conversion layer 9 has two principal surfaces and at least one side surface. The pair of electrodes 8 and 10 are attached to the at least one side surface in a direction perpendicular to the thickness direction of the second photoelectric conversion layer 9. In the present embodiment, the second photoelectric conversion layer 9 has a rectangular shape in plan view and has four side surfaces. For example, when the second photoelectric conversion layer 9 has a circular shape, the number of side surfaces is one.

The pair of electrodes 8 and 10 include a second negative electrode 8 and a second positive electrode 10. In the present specification, "the second negative electrode 8, the second photoelectric conversion layer 9, and the second positive electrode 10" may be referred to as "bottom cell components."

The second negative electrode 8 has, for example, a rectangular shape in plan view. The second negative electrode 8 is attached to a side surface of the second photoelectric conversion layer 9. The second negative electrode 8 is disposed between the second substrate 6 and the third substrate 7. When the second substrate 6 and the second negative electrode 8 are projected onto a plane perpendicular to the thickness direction of the second photoelectric conversion layer 9, part or all of the projection image of the second negative electrode 8 is located inside the projection image of the second substrate 6. In this case, the second negative electrode 8 may or may not be in contact with each of the second substrate 6 and the third substrate 7. The second negative electrode 8 may be in contact with the second photoelectric conversion layer 9. More specifically, the second negative electrode 8 may be in contact with the entire side surface of the second photoelectric conversion layer 9. The second negative electrode 8 may be disposed, for example, between the second substrate 6 and the second photoelectric conversion layer 9. The second negative electrode 8 may be disposed, for example, between the second photoelectric conversion layer 9 and the third substrate 7.

The second positive electrode 10 has, for example, a rectangular shape in plan view. The second positive electrode 10 is attached to a side surface of the second photoelectric conversion layer 9. The second positive electrode 10 is disposed between the second substrate 6 and the third substrate 7. When the second substrate 6 and the second positive electrode 10 are projected onto a plane perpendicular to the thickness direction of the second photoelectric conversion layer 9, part or all of the projection image of the second positive electrode 10 is located inside the projection image of the second substrate 6. In this case, the second positive electrode 10 may or may not be in contact with each of the second substrate 6 and the third substrate 7. The second positive electrode 10 may be in contact with the second photoelectric conversion layer 9. More specifically, the second positive electrode 10 may be in contact with the entire side surface of the second photoelectric conversion layer 9. The second positive electrode 10 may be disposed, for example, between the second substrate 6 and the second photoelectric conversion layer 9. The second positive electrode 10 may be disposed, for example, between the second photoelectric conversion layer 9 and the third substrate 7.

The second negative electrode 8 and the second positive electrode 10 face each other in the direction perpendicular to the arrangement direction of the second substrate 6 and the third substrate 7. The second negative electrode 8 and the second positive electrode 10 are attached to the second photoelectric conversion layer 9. Since the second negative electrode 8 and the second positive electrode 10 are positioned so as not to block the incident light, they do not need to be transparent electrodes. Specifically, with the structure of the present embodiment, the use of transparent electrodes can be avoided. Since the incident light is not absorbed by the electrodes, the solar cell 100 in the present embodiment can have high photoelectric conversion efficiency.

The bottom cell 120 further includes terminals 11c and 11d. The terminal 11c is electrically connected to the second negative electrode 8. The terminal 11d is electrically connected to the second positive electrode 10.

The bottom cell 120 further includes a sealing portion 12. The sealing portion 12 surrounds the second negative electrode 8, the second photoelectric conversion layer 9, and the second positive electrode 10. The sealing portion 12 may be in contact with each of the second negative electrode 8, the second photoelectric conversion layer 9, and the second positive electrode 10. The sealing portion 12 may be in contact with each of the second substrate 6 and the third substrate 7. With the above structure, the bottom cell components can be isolated from the external environment. Therefore, deterioration of the solar cell due to intrusion of water or oxygen into the bottom cell components can be prevented.

The distance between the second negative electrode 8 and the second positive electrode 10 can be determined from the carrier diffusion length in the second photoelectric conversion layer 9. Since the second photoelectric conversion layer 9 contains a perovskite material, the carrier diffusion length in the second photoelectric conversion layer 9 is longer than that of a photoelectric conversion material used for conventional silicon solar cells. The carrier diffusion length of the photoelectric conversion layer containing the perovskite material is about 200 μm. The distance between the second negative electrode 8 and the second positive electrode 10 is set to be about 10 times the carrier diffusion length in the second photoelectric conversion layer 9. The distance between the second negative electrode 8 and the second positive electrode 10 is, for example, equal to or more than 0.2 mm and equal to or less than 2 mm.

When the second photoelectric conversion layer 9 is an n-type silicon layer, the carrier diffusion length in the second photoelectric conversion layer 9 is about 100 μm. The distance between the electrodes is set to be about 10 times the carrier diffusion length. Therefore, he distance between the second negative electrode 8 and the second positive electrode 10 is, for example, equal to or more than 0.1 mm and equal to or less than 1 mm.

Next, the basic operation principle of the solar cell 100 will be described. When the solar cell 100 is irradiated with light, the first photoelectric conversion layer 3 in the top cell 110 absorbs the light, and electrons and holes are generated. The electrons move to the first negative electrode 2. The holes move to the first positive electrode 4. In the solar cell 100, an electric current can thereby be drawn from the first negative electrode 2 serving as a negative electrode and the first positive electrode 4 serving as a positive electrode. In the bottom cell 120, the second photoelectric conversion layer 9 absorbs the light, and electrons and holes are generated. The electrons move to the second negative electrode 8. The holes move to the second positive electrode 10. In the solar cell 100, an electric current can be drawn from the second negative electrode 8 serving as a negative electrode and the second positive electrode 10 serving as a positive electrode.

The conventional four-terminal tandem solar cell requires three transparent electrodes. The "transparent electrodes" mean electrodes formed of an inorganic oxide doped with a metal. Examples of the inorganic oxide doped with a metal include FTO and ITO. The use of the transparent electrodes causes a reduction in light transmittance and an increase in electrical resistance. This leads to a reduction in the power generation efficiency of the solar cells.

In the solar cell 100 according to the present embodiment, the electrodes are disposed on side surfaces of the photoelectric conversion layers. Since the incident light is not absorbed by the electrodes, the solar cell 100 can have high photoelectric conversion efficiency. Moreover, the use of the transparent electrodes can be avoided.

[Specific Structure of Solar Cell]

The components of the solar cell 100 will be described specifically.

(First Substrate 1)

The first substrate 1 has light-transmitting properties. No particular limitation is imposed on the material forming the first substrate so long as the material has light-transmitting properties. The first substrate 1 plays a role in holding the layers included in the top cell 110. The first substrate 1 used may be a glass substrate or a plastic substrate. The plastic substrate may be a plastic film. The first substrate 1 may be formed by stacking an inorganic or organic sealing layer on a surface of the solar cell 100.

The first substrate 1 transmits light, for example, in the ultraviolet to near infrared region. The wavelength of the light allowed to pass through the first substrate 1 depends on the absorption wavelength of the first photoelectric conversion layer 3. The wavelength of the light allowed to pass through the first substrate 1 is, for example, equal to or longer than 380 nm and equal to or shorter than 2000 nm. The light transmittance of the first substrate 1 may be equal to or higher than 90% and may be equal to or higher than 95%. The term "light-transmitting properties" means that 90% or more of light having a wavelength equal to or longer than 380 nm and equal to shorter than 2000 nm passes through the substrate. The light transmittance can be measured using, for example, an ultraviolet-visible-near infrared spectrophotometer. The thickness of the first substrate 1 is, for example, equal to or more than 0.3 mm and equal to or less than 0.7 mm. By appropriately setting the thickness of the first substrate 1, the first substrate 1 can hold the layers included in the top cell 100 of the solar cell 110 and can efficiently transmit light.

(Second Substrates 5 and 6)

The second substrate 5 has light-transmitting properties. No particular limitation is imposed on the material forming the second substrate 5 so long as the material has light-transmitting properties. The second substrate 5 holds the layers included in the top cell 110 of the solar cell 100.

The second substrate 6 has light-transmitting properties. No particular limitation is imposed on the material forming the second substrate 6 so long as the material has light-transmitting properties. The second substrate 6 plays a role in holding the layers included in the bottom cell 120 of the solar cell 100.

The second substrates 5 and 6 used may each be a glass substrate or a plastic substrate. The plastic substrate may be a plastic film. The material forming the second substrate 5 and the material forming the second substrate 6 may be the same or different. No particular limitation is imposed on the material forming the second substrate 5 and the material forming the second substrate 6 so long as they can electrically insulate the top cell 110 and the bottom cell 120 from each other. The second substrates 5 and 6 may be formed by stacking inorganic or organic sealing layers.

Light in the ultraviolet to near infrared region passes through the second substrates 5 and 6. The wavelength of the light allowed to pass through the second substrates 5 and 6 depends on the absorption wavelength of the second photoelectric conversion layer 9. The wavelength of the light allowed to pass through the second substrate 5 is, for example, equal to or longer than 380 nm and equal to or shorter than 2000 nm. The wavelength of the light allowed to pass through the second substrate 6 may be the same as or different from the wavelength of the light allowed to pass through the second substrate 5. The light transmittance of the second substrate 5 may be equal to or higher than 90%. The light transmittance of the second substrate 6 may be the same as or different from the light transmittance of the second substrate 5. The light transmittance may be measured using, for example, an ultraviolet-visible-near infrared spectrophotometer. The thickness of the second substrate 5 is, for example, equal to or more than 0.3 mm and equal to or less than 0.7 mm. The thickness of the second substrate 6 may be the same as or different from the thickness of the second substrate 5. By appropriately setting the thickness of the second substrate 5 and the thickness of the second substrate 6, the second substrates 5 and 6 can hold the layers included in the top cell 110 and the bottom cell 120 and can transmit light efficiently.

The solar cell 100 includes the second substrates 5 and 6. However, the solar cell 100 may include only the second substrate 5 or 6. By reducing the number of second substrates, the solar cell can transmit light more sufficiently. Therefore, the photoelectric conversion efficiency of the bottom cell 120 of the solar cell 100 can be improved.

(First Photoelectric Conversion Layer 3)

The first photoelectric conversion layer 3 contains a perovskite material. Examples of the perovskite material include perovskite crystals and structures similar thereto. Examples of the perovskite crystals include compounds having a composition formula of $ABX_3$. Here, A is a monovalent cation, B is a divalent cation, and X is a halogen anion. Examples of the similar structures include: perovskite compounds having halogen anion defects; and perovskite compounds in which the monovalent cation or the halogen anion includes a plurality of types of elements. It is only necessary that the first photoelectric conversion layer 3 contain the perovskite material, and the first photoelectric conversion layer 3 may contain impurities. The first photoelectric conversion layer 3 may further contain an additional compound different from the perovskite material.

The band gap of the first photoelectric conversion layer 3 is larger than the band gap of the second photoelectric conversion layer 9 described later. The band gap of the first photoelectric conversion layer 3 may be about 1.9 eV. Examples of the perovskite material that can be used for the first photoelectric conversion layer 3 include $CsPbI_3$ and $CsPbBr_3$. The band gap of $CsPbI_3$ is 1.7 eV, and the band gap of $CsPbBr_3$ is 2.0 eV. Other examples of the perovskite material that can be used for the first photoelectric conversion layer 3 include $CsPbBr_xI_{3-x}$. Here, x is $0 \leq x \leq 3$. The band gap of $CsPbBr_xI_{3-x}$ is appropriately controlled in the range of 1.7 eV to 2.0 eV.

The thickness of the first photoelectric conversion layer 3 is, for example, equal to or more than 100 nm and equal to or less than 10 μm. By appropriately set the thickness of the first photoelectric conversion layer 3, the first photoelectric conversion layer 3 can absorb visible light sufficiently. Therefore, the solar cell 100 provided can have high photoelectric conversion efficiency.

(First Negative Electrode 2)

The first negative electrode 2 has electrical conductivity. The first negative electrode 2 is not in ohmic contact with the first photoelectric conversion layer 3. Moreover, the first negative electrode 2 has the ability to block holes from the first photoelectric conversion layer 3. The ability to block holes from the first photoelectric conversion layer 3 means the ability to allow only electrons generated in the first photoelectric conversion layer 3 to pass through and to block holes generated in the first photoelectric conversion layer 3. A material with such an ability is a material whose work function is smaller than the difference between the vacuum level and the energy level of the upper edge of the valence band of the first photoelectric conversion layer 3. A material whose work function is smaller than the difference between the vacuum level and the Fermi level of the first photoelectric conversion layer 3 may also be used. Specific examples of such a material include aluminum. The first negative electrode 2 may not have transparency. The first negative electrode 2 may be a non-transparent electrode. The non-transparent electrode contains a metal material or a carbon material as a main component. The term "main component" means a component whose weight ratio in the non-transparent electrode is largest. The non-transparent electrode contains substantially no oxides. The phrase "contains substantially no oxides" means that no oxides are intentionally added to the non-transparent electrode. The first negative electrode 2 may be formed of a metal material. The thickness of the first negative electrode 2 may be in the range of from 1 nm to 1000 nm. The thickness of the first negative electrode 2 may be equal to or more than 100 nm in order to reduce its sheet resistance.

(First Positive Electrode 4)

The first positive electrode 4 has electrical conductivity. The first positive electrode 4 is not in ohmic contact with the first photoelectric conversion layer 3. The first positive electrode 4 has the ability to block electrons from the first photoelectric conversion layer 3. The ability to block electrons from the first photoelectric conversion layer 3 means the ability to allow only holes generated in the first photoelectric conversion layer 3 to pass through and to block electrons generated in the first photoelectric conversion layer 3. A material with such an ability is a material whose Fermi energy is lower than the energy level of the lower edge of the conduction band of the first photoelectric conversion layer 3. The above material may be a material whose work function is smaller than the difference between the vacuum level and the Fermi energy of the first photoelectric conversion layer 3. Specific examples of such a material include platinum, gold, and carbon materials such as graphene. The first positive electrode 4 may not have transparency. The first positive electrode 4 may be a non-transparent electrode. The non-transparent electrode contains a metal material or a carbon material as a main component. The non-transparent electrode contains substantially no oxides. The first positive electrode 4 may be formed of a metal material. The thickness of the first positive electrode 4 may be in the range of from 1 nm to 1000 nm. The thickness of the first positive electrode 4 may be equal to or more than 100 nm in order to reduce its sheet resistance.

(Third Substrate 7)

The third substrate 7 is an optional component. The third substrate 7 used may be, for example, a glass substrate or a plastic substrate. The plastic substrate may be a plastic film.

(Second Photoelectric Conversion Layer 9)

The second photoelectric conversion layer 9 contains, for example, a perovskite material. Examples of the perovskite material include perovskite crystals and structures similar thereto. Examples of the perovskite crystals include compounds having a composition formula of $ABX_3$. Here, A is a monovalent cation, B is a divalent cation, and X is a halogen anion. Examples of the similar structures include: perovskite compounds having halogen anion defects; and perovskite compounds in which the monovalent cation or the halogen anion includes a plurality of types of elements. It is only necessary that the second photoelectric conversion layer 9 contain the perovskite material, and the first photoelectric conversion layer 3 may contain impurities. The second photoelectric conversion layer 9 may further contain an additional compound different from the perovskite material.

The band gap of the second photoelectric conversion layer 9 is smaller than the band gap of the first photoelectric conversion layer 3. The band gap of the second photoelectric conversion layer 9 may be about 1.0 eV. Examples of the perovskite material that can be used for the second photoelectric conversion layer 9 include $CH_3NH_3SnI_3$. The band gap of $CH_3NH_3SnI_3$ is 1.25 eV.

Other examples of the material that can be used for the second photoelectric conversion layer 9 include silicon. An n-type silicon single crystal may be used for the second photoelectric conversion layer 9. The band gap of silicon is about 1.1 eV and is smaller than the band gap of the first photoelectric conversion layer 3. When silicon is used for the second photoelectric conversion layer 9, a silicon substrate doped with phosphorus (P) may be used as the n-type silicon layer. When silicon is used for the second photoelectric conversion layer 9, the thickness of the second photoelectric conversion layer 9 is equal to or more than 200 μm and equal to or less than 300 μm.

(Second Negative Electrode 8)

The second negative electrode 8 has electrical conductivity. The second negative electrode 8 is not in ohmic contact with the second photoelectric conversion layer 9. The second negative electrode 8 has the ability to block holes from the second photoelectric conversion layer 9. The ability to block holes from the second photoelectric conversion layer 9 means the ability to allow only electron generated in the second photoelectric conversion layer 9 to pass through and to block holes generated in the second photoelectric conversion layer 9. A material with such an ability is a material whose work function is smaller than the difference between the vacuum level and the energy level of the upper edge of the valence band of the second photoelectric conversion layer 9. A material whose work function is smaller than the difference between the vacuum level and the Fermi level of the second photoelectric conversion layer 9 may also be used. Specific examples of such a material include aluminum. The second negative electrode 8 may not have transparency. The second negative electrode 8 may be a non-transparent electrode formed of a metal material. The non-transparent electrode contains a metal material or a carbon material as a main component. The non-transparent electrode contains substantially no oxides. The thickness of the second negative electrode 8 may be equal to or more than 1 nm and equal to or less than 1000 nm. The thickness of the second negative electrode 8 may be 100 nm or more in order to reduce its sheet resistance.

(Second Positive Electrode 10)

The second positive electrode 10 has electrical conductivity. The second positive electrode 10 is not in ohmic contact with the second photoelectric conversion layer 9. The second positive electrode 10 has the ability to block electrons from the second photoelectric conversion layer 9. The ability to block electrons from the second photoelectric conversion layer 9 means the ability to allow only holes generated in the second photoelectric conversion layer 9 to pass through and to block electrons generated in the second photoelectric conversion layer 9. A material with such an ability is a material whose Fermi energy is lower than the energy level of the lower edge of the conduction band of the second photoelectric conversion layer 9. The above material may be a material whose work function is smaller than the difference between the vacuum level and the Fermi energy of the second photoelectric conversion layer 9. Specific examples of such a material include platinum, gold, and carbon materials such as graphene. The second positive electrode 10 may not have transparency. The second positive electrode 10 may be a non-transparent electrode formed of a metal material. The non-transparent electrode contains a metal material or a carbon material as a main component. The non-transparent electrode contains substantially no oxides. The thickness of the second positive electrode 10 may be in the range of from 1 nm to 1000 nm. The thickness of the second positive electrode 10 may be 100 nm or more in order to reduce its sheet resistance.

(Terminals 11)

The terminals 11 connect the top cell 110 to the bottom cell 120 in series. Examples of the material that can be used for the terminals 11 include silver and copper.

(Sealing Portions 12)

One of the sealing portions 12 bonds the first substrate 1 to the second substrate 5. The other sealing portion 12 bonds the second substrate 6 to the third substrate 7. Examples of the material that can be used for the sealing portions 12 include epoxy resins and ethylene-vinyl acetate copolymers (EVA).

[Method for Producing Solar Cell]

Next, an example of a method for producing the solar cell 100 according to the present embodiment will be described.

First, the top cell 110 of the solar cell 100 is produced.

To form the first photoelectric conversion layer 3, a spin coating method or vacuum deposition can be used. The spin coating method will next be described as an example.

First, $PbI_2$ and CsI in a molar amount equal to the molar amount of $PbI_2$ are added to an organic solvent to prepare a perovskite precursor solution. The organic solvent used is, for example, a solvent mixture of dimethyl sulfoxide (DMSO):N,N-dimethylformamide (DMF)=1:1.

The second substrate 5 used is a glass substrate. The perovskite precursor solution is applied to the glass substrate using the spin coating method under the condition of a rotation speed of 6000 rpm. To facilitate nucleation, 600 μL of toluene, which is a poor solvent, may be added dropwise to the perovskite precursor solution. The glass substrate with the perovskite precursor solution applied thereto is fired on a hot plate at 100° C. for 30 minutes to thereby obtain a $CsPbI_3$ film having the perovskite structure. Then a solvent such as DMF is used to remove part of the $CsPbI_3$ film, and the first photoelectric conversion layer 3 is thereby formed.

Next, the first negative electrode 2 and the first positive electrode 4 are formed on the glass substrate by vacuum deposition. Any of the first negative electrode 2 and the first positive electrode 4 may be formed first.

Specifically, aluminum (Al) used for the first negative electrode 2 is evaporated onto the second substrate 5. Gold (Au) used for the first positive electrode 4 is evaporated onto the second substrate 5.

A glass substrate used as the first substrate 1 is placed on the second substrate 5 with the first negative electrode 2, the first photoelectric conversion layer 3, and the first positive electrode 4 formed thereon. The first negative electrode 2, the first photoelectric conversion layer 3, and the first positive electrode 4 disposed between the first substrate 1 and the second substrate 5 are sealed with an epoxy resin. Then the epoxy resin is cured with ultraviolet (UV) light to thereby produce the top cell 110.

Next, the bottom cell 120 of the solar cell 100 is produced.

When the second photoelectric conversion layer 9 contains a perovskite material, the second photoelectric conversion layer 9 may be formed by the same method as the method for producing the first photoelectric conversion layer 3.

When the second photoelectric conversion layer 9 contains the perovskite material, the second photoelectric conversion layer 9 may further contain, for example, $CH_3NH_3SnI_3$ in consideration of the band gap.

First, $SnI_2$ and $CH_3NH_3I$ in a molar amount equal to the molar amount of $SnI_2$ are added to an organic solvent to prepare a perovskite precursor solution. The organic solvent used is, for example, a solvent mixture of dimethyl sulfoxide (DMSO): N,N-dimethylformamide (DMF)=1:1.

The third substrate 7 used is a glass substrate. The perovskite precursor solution is applied to the glass substrate using the spin coating method under the condition of a rotation speed of 6000 rpm. To facilitate nucleation, 600 μL of toluene, which is a poor solvent, may be added dropwise to the perovskite precursor solution. The glass substrate with the perovskite precursor solution applied thereto is fired on a hot plate at 100° C. for 30 minutes to thereby obtain a $CH_3NH_3SnI_3$ film having the perovskite structure. Then a solvent such as DMF is used to remove part of the $CH_3NH_3SnI_3$ film, and the second photoelectric conversion layer 9 is thereby formed.

Next, the second negative electrode 8 and the second positive electrode 10 are formed on the glass substrate by vacuum deposition. Any of the second negative electrode 8 and the second positive electrode 10 may be formed first.

Specifically, aluminum (Al) used for the second negative electrode 8 is evaporated onto the third substrate 7. Gold (Au) used for the second positive electrode 10 is evaporated onto the third substrate 7.

A glass substrate used as the second substrate 6 is placed on the third substrate 7 with the second negative electrode 8, the second photoelectric conversion layer 9, and the second positive electrode 10 formed thereon. The second negative electrode 8, the second photoelectric conversion layer 9, and the second positive electrode 10 disposed between the second substrate 6 and the third substrate 7 are sealed with an epoxy resin. Then the epoxy resin is cured with UV light, and the bottom cell 120 is thereby produced. Then the top cell 110 is placed on the bottom cell 120. Terminals are connected to the negative electrode and the positive electrode of each cell, and the solar cell 100 is thereby obtained.

When n-type single crystal silicon doped with phosphorus (P) is used for the second photoelectric conversion layer 9, the bottom cell components may be produced by vapor deposition, a sputtering method, a chemical vapor deposition (CVD) method, etc. For example, a multilayer body in which the components of the bottom cell 120 are stacked is produced. The multilayer body formed includes the second negative electrode 8, the second photoelectric conversion layer 9, and the second positive electrode 10 in this order. Specifically, Al used as the second negative electrode 8 is vapor-deposited on the second photoelectric conversion layer 9, and Ag used as the second positive electrode 10 is vapor-deposited. Then the multilayer body obtained is cut, for example, at 1 mm intervals, and the bottom cell components are thereby obtained.

Some other embodiments will next be described. Components common to the solar cell 100 in embodiment 1 and solar cells in other embodiments are denoted by the same reference numerals, and the description thereof may be omitted. The descriptions of the embodiments can be interchangeably applied so long as no technical conflicts occur. The embodiments may be combined with one another so long as no technical conflicts occur.

Embodiment 2

Figure 2A:
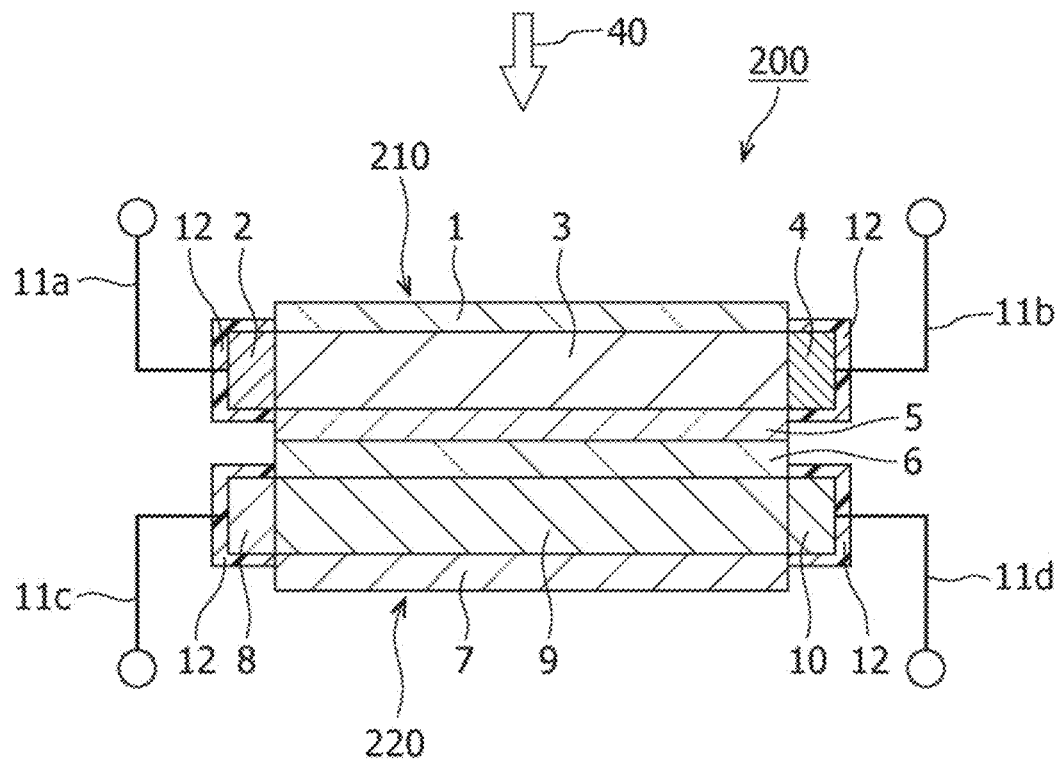
FIG. 2A is a cross-sectional view of a solar cell according to embodiment 2.
Figure 2B:
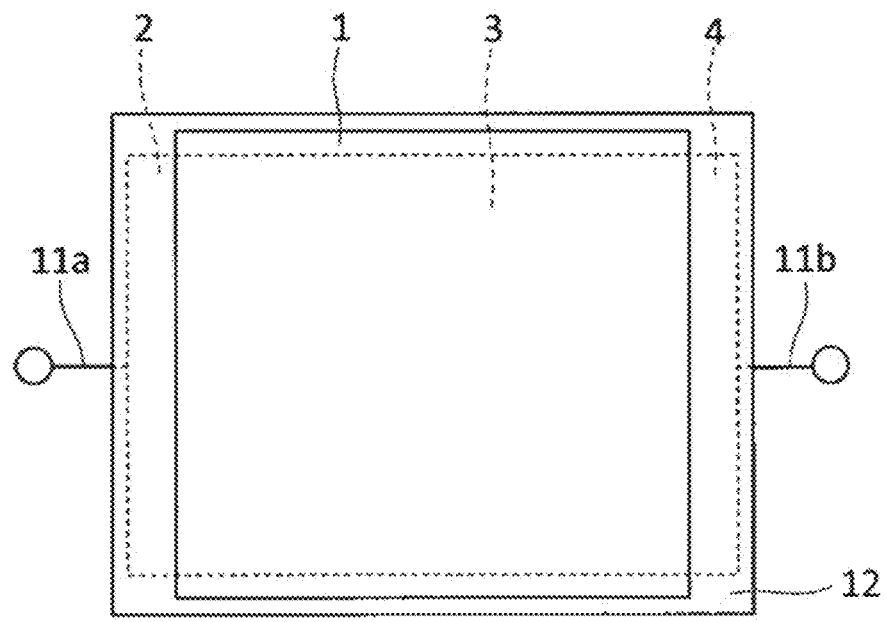
FIG. 2B is a top view of the solar cell according to embodiment 2.

FIG. 2A is a cross-sectional view of a solar cell 200 according to embodiment 2. FIG. 2B is a top view of the solar cell 200 according to embodiment 2.

In a direction perpendicular to the thickness direction of the first photoelectric conversion layer 3, the size of the first photoelectric conversion layer 3 may be the same as the size of the first substrate 1. In the direction perpendicular to the thickness direction of the first photoelectric conversion layer 3, the size of the first photoelectric conversion layer 3 may be larger than the size of the first substrate 1. In this case, when the first substrate 1 and the first photoelectric conversion layer 3 are projected onto a plane perpendicular to the thickness direction of the first photoelectric conversion layer 3, part of the projection image of the first photoelectric conversion layer 3 is located outside the projection image of the first substrate 1. With this structure, the area of the principal surfaces of the first photoelectric conversion layer 3 can be further increased. Therefore, the photoelectric conversion efficiency can be improved.

The first negative electrode 2 is attached to a side surface of the first photoelectric conversion layer 3. The first negative electrode 2 may be in contact with the first photoelectric conversion layer 3. More specifically, the first negative electrode 2 may be in contact with the entire side surface of the first photoelectric conversion layer 3. The first negative electrode 2 may be in contact with a side surface of the first substrate 1 and/or a side surface of the second substrate 5. In this case, the thickness of the first negative electrode 2 may be larger than the thickness of the first photoelectric conversion layer 3. The first negative electrode 2 may be disposed, for example, between the first substrate 1 and the first photoelectric conversion layer 3. The first negative electrode 2 may be disposed, for example, between the first photoelectric conversion layer 3 and the second substrate 5. Part of the first photoelectric conversion layer 3 may be embedded in the first negative electrode 2. Part of the first negative electrode 2 may be embedded in the first photoelectric conversion layer 3.

The first positive electrode 4 is attached to a side surface of the first photoelectric conversion layer 3. The first positive electrode 4 may be in contact with the first photoelectric conversion layer 3. More specifically, the first positive electrode 4 may be in contact with the entire side surface of the first photoelectric conversion layer 3. The first positive electrode 4 may be in contact with a side surface of the first substrate 1 and/or a side surface of the second substrate 5. In this case, the thickness of the first positive electrode 4 may be larger than the thickness of the first photoelectric conversion layer 3. The first positive electrode 4 may be disposed, for example, between the first substrate 1 and the first photoelectric conversion layer 3. The first positive electrode 4 may be disposed, for example, between the first photoelectric conversion layer 3 and the second substrate 5. Part of the first photoelectric conversion layer 3 may be embedded in the first positive electrode 4. Part of the first positive electrode 4 may be embedded in the first photoelectric conversion layer 3.

The top cell 210 further includes a sealing portion 12. The sealing portion 12 surrounds the first negative electrode 2, the first photoelectric conversion layer 3, and the first positive electrode 4. The sealing portion 12 may be in contact with each of the first negative electrode 2, the first photoelectric conversion layer 3, and the first positive electrode 4. The sealing portion 12 may be in contact with each of the first substrate 1 and the second substrate 5. More specifically, the sealing portion 12 may be in contact with each of a side surface of the first substrate 1 and a side surface of the second substrate 5. With the above structure, the top cell components can be isolated from the external environment. Therefore, deterioration of the solar cell due to intrusion of water or oxygen into the top cell components can be prevented.

In a direction perpendicular to the thickness direction of the second photoelectric conversion layer 9, the size of the second photoelectric conversion layer 9 may be the same as the size of the second substrate 6. In the direction perpendicular to the thickness direction of the second photoelectric conversion layer 9, the size of the second photoelectric conversion layer 9 may be larger than the size of the second substrate 6. In this case, when the second substrate 6 and the second photoelectric conversion layer 9 are projected onto a plane perpendicular to the thickness direction of the second photoelectric conversion layer 9, part of the projection image of the second photoelectric conversion layer 9 is located outside the projection image of the second substrate 6. With this structure, the area of the principal surfaces of the second photoelectric conversion layer 9 can be further increased. Therefore, the photoelectric conversion efficiency can be improved.

The second negative electrode 8 is attached to a side surface of the second photoelectric conversion layer 9. The second negative electrode 8 may be in contact with the second photoelectric conversion layer 9. More specifically, the second negative electrode 8 may be in contact with the entire side surface of the second photoelectric conversion layer 9. The second negative electrode 8 may be in contact with a side surface of the second substrate 6 and/or a side surface of the third substrate 7. In this case, the thickness of the second negative electrode 8 may be larger than the thickness of the second photoelectric conversion layer 9. The second negative electrode 8 may be disposed, for example, between the second substrate 6 and the second photoelectric conversion layer 9. The second negative electrode 8 may be disposed, for example, between the second photoelectric conversion layer 9 and the third substrate 7. Part of the second photoelectric conversion layer 9 may be embedded in the second negative electrode 8. Part of the second negative electrode 8 may be embedded in the second photoelectric conversion layer 9.

The second positive electrode 10 is attached to a side surface of the second photoelectric conversion layer 9. The second positive electrode 10 may be in contact with the second photoelectric conversion layer 9. More specifically, the second positive electrode 10 may be in contact with the entire side surface of the second photoelectric conversion layer 9. The second positive electrode 10 may be in contact with a side surface of the second substrate 6 and/or a side surface of the third substrate 7. In this case, the thickness of the second positive electrode 10 may be larger than the thickness of the second photoelectric conversion layer 9. The second positive electrode 10 may be disposed, for example, between the second substrate 6 and the second photoelectric conversion layer 9. The second positive electrode 10 may be disposed, for example, between the second photoelectric conversion layer 9 and the third substrate 7. Part of the second photoelectric conversion layer 9 may be embedded in the second positive electrode 10. Part of the second positive electrode 10 may be embedded in the second photoelectric conversion layer 9.

The bottom cell 220 further includes a sealing portion 12. The sealing portion 12 surrounds the second negative electrode 8, the second photoelectric conversion layer 9, and the second positive electrode 10. The sealing portion 12 may be in contact with each of the second negative electrode 8, the second photoelectric conversion layer 9, and the second positive electrode 10. The sealing portion 12 may be in contact with each of the second substrate 6 and the third substrate 7. More specifically, the sealing portion 12 may be in contact with each of a side surface of the second substrate 6 and a side surface of the third substrate 7. With the above structure, the bottom cell components can be isolated from the external environment. Therefore, deterioration of the solar cell due to intrusion of water or oxygen into the bottom cell components can be prevented.

Embodiment 3

Figure 3A:
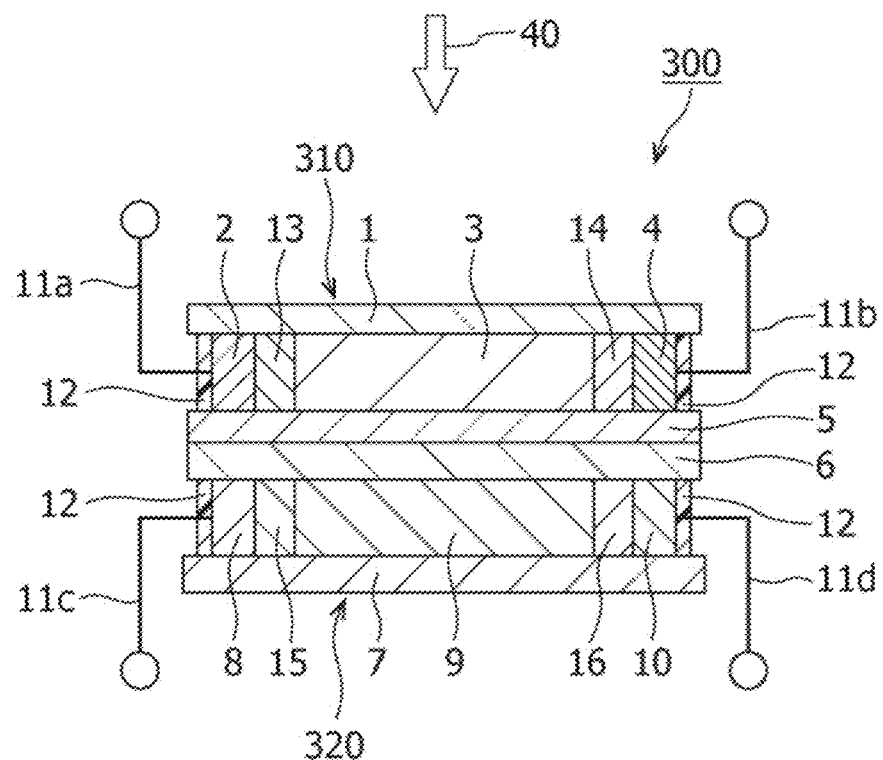
FIG. 3A is a cross-sectional view of a solar cell according to embodiment 3.
Figure 3B:
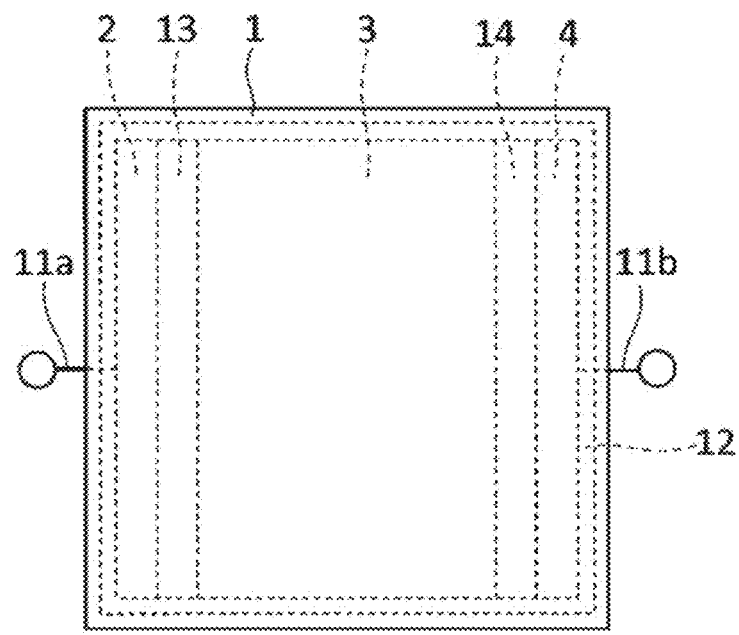
FIG. 3B is a top view of the solar cell according to embodiment 3.

FIG. 3A is a cross-sectional view of a solar cell 300 according to embodiment 3. FIG. 3B is a top view of the solar cell 300 according to embodiment 3.

As shown in FIG. 3A, in the solar cell 300, a top cell 310 further includes a first electron transport layer 13 and a first hole transport layer 14.

The first electron transport layer 13 has, for example, a rectangular shape in plan view. The first electron transport layer 13 is attached to a side surface of the first photoelectric conversion layer 3. More specifically, the first electron transport layer 13 may be in contact with the entire side surface of the first photoelectric conversion layer 3. The first electron transport layer 13 is disposed between the first negative electrode 2 and the first photoelectric conversion layer 3. The first electron transport layer 13 is in contact with the first negative electrode 2. The first electron transport layer 13 may or may not be in contact with each of the first substrate 1 and the second substrate 5. The first electron transport layer 13 may be in contact with the first photoelectric conversion layer 3 only at its side surface. The first electron transport layer 13 may be in contact with the first negative electrode 2 only at its side surface. The first electron transport layer 13 may be disposed, for example, between the first substrate 1 and the first photoelectric conversion layer 3. The first electron transport layer 13 may be disposed, for example, between the first photoelectric conversion layer 3 and the second substrate 5.

The first hole transport layer 14 has, for example, a rectangular shape in plan view. The first hole transport layer 14 is attached to a side surface of the first photoelectric conversion layer 3. More specifically, the first hole transport layer 14 may be in contact with the entire side surface of the first photoelectric conversion layer 3. The first hole transport layer 14 is disposed between the first positive electrode 4 and the first photoelectric conversion layer 3. The first hole transport layer 14 is in contact with the first positive electrode 4. The first hole transport layer 14 may or may not be in contact with each of the first substrate 1 and the second substrate 5. The first hole transport layer 14 may be in contact with the first photoelectric conversion layer 3 only at its side surface. The first hole transport layer 14 may be in contact with the first positive electrode 4 only at its side surface. The first hole transport layer 14 may be disposed, for example, between the first substrate 1 and the first photoelectric conversion layer 3. The first hole transport layer 14 may be disposed, for example, between the first photoelectric conversion layer 3 and the second substrate 5. With the above structure, the photoelectric conversion efficiency can be improved.

In the top cell 310, the first electron transport layer 13 and the first hole transport layer 14 face each other in the direction perpendicular to the arrangement direction of the first substrate 1 and the second substrate 5. The first electron transport layer 13 and the first hole transport layer 14 are attached to the first photoelectric conversion layer 3. Since the first electron transport layer 13 and the first hole transport layer 14 are positioned so as not to block incident light, they do not need to transmit visible light and infrared light.

The bottom cell 320 further includes a second electron transport layer 15 and a second hole transport layer 16.

The second electron transport layer 15 has, for example, a rectangular shape in plan view. The second electron transport layer 15 is attached to a side surface of the second photoelectric conversion layer 9. More specifically, the second electron transport layer 15 may be in contact with the entire side surface of the second photoelectric conversion layer 9. The second electron transport layer 15 is disposed between the second negative electrode 8 and the second photoelectric conversion layer 9. The second electron transport layer 15 is in contact with the second negative electrode 8. The second electron transport layer 15 may or may not be in contact with each of the second substrate 6 and the third substrate 7. The second electron transport layer 15 may be in contact with the second photoelectric conversion layer 9 only at its side surface. The second electron transport layer 15 may be in contact with the second negative electrode 8 only at its side surface. The second electron transport layer 15 may be disposed, for example, between the second substrate 6 and the second photoelectric conversion layer 9. The second electron transport layer 15 may be disposed, for example, between the second photoelectric conversion layer 9 and the third substrate 7.

The second hole transport layer 16 has, for example, a rectangular shape in plan view. The second hole transport layer 16 is attached to a side surface of the second photoelectric conversion layer 9. More specifically, the second hole transport layer 16 may be in contact with the entire side surface of the second photoelectric conversion layer 9. The second hole transport layer 16 is disposed between the second positive electrode 10 and the second photoelectric conversion layer 9. The second hole transport layer 16 is in contact with the second positive electrode 10. The second hole transport layer 16 may or may not be in contact with each of the second substrate 6 and the third substrate 7. The second hole transport layer 16 may be in contact with the second photoelectric conversion layer 9 only at its side surface. The second hole transport layer 16 may be in contact with the second positive electrode 10 only at its side surface. With the above structure, the photoelectric conversion efficiency can be improved.

In the bottom cell 320, the second electron transport layer 15 and the second hole transport layer 16 face each other in the direction perpendicular to the arrangement direction of the second substrate 6 and the third substrate 7. The second electron transport layer 15 and the second hole transport layer 16 are attached to the second photoelectric conversion layer 9. Since the second electron transport layer 15 and the second hole transport layer 16 are positioned so as not to block incident light, they do not need to transmit visible light and infrared light.

While the solar cell 300 includes the first electron transport layer 13 and the first hole transport layer 14, the second electron transport layer 15 and the second hole transport layer 16 may be omitted. Alternatively, while the solar cell 300 includes the second electron transport layer 15 and the second hole transport layer 16, the first electron transport layer 13 and the first hole transport layer 14 may be omitted. While the first electron transport layer 13 is provided, the first hole transport layer 14 may be omitted. While the first hole transport layer 14 is provided, the first electron transport layer 13 may be omitted. While the second electron transport layer 15 is provided, the second hole transport layer 16 may be omitted. While the second hole transport layer 16 is provided, the second electron transport layer 15 may be omitted.

(First Electron Transport Layer 13)

The first electron transport layer 13 contains a semiconductor. Examples of the semiconductor include organic and inorganic n-type semiconductors. The first electron transport layer 13 is formed of, for example, an inorganic material.

Examples of the organic n-type semiconductors include imide compounds, quinone compounds, fullerenes, and fullerene derivatives. Examples of the inorganic n-type semiconductors include metal oxides, metal nitrides, and perovskite compounds. Examples of the metal element oxide that can be used include oxides of Cd, Zn, In, Pb, Mo, W, Sb, Bi, Cu, Hg, Ti, Ag, Mn, Fe, V, Sn, Zr, Sr, Ga, Si, and Cr. More specific examples include $TiO_2$. Examples of the metal element nitride include GaN. Examples of the perovskite oxide include $SrTiO_3$ and $CaTiO_3$.

The first electron transport layer 13 may be formed of a material having a band gap larger than 6.0 eV. Examples of the material having a band gap larger than 6.0 eV include alkali metal halides, alkaline earth metal halides, alkali metal oxides, and silicon dioxide. Examples of the alkali metal halides include lithium fluoride. Examples of the alkaline earth metal halides include calcium fluoride. Examples of the alkaline earth metal oxides include magnesium oxide. To facilitate the formation of the first photoelectric conversion layer 3, the thickness of the first electron transport layer 13 may be slightly larger than the thickness of the first photoelectric conversion layer 3. The thickness of the first electron transport layer 13 may be equal to or more than 150 nm and equal to or less than 1000 nm.

(First Hole Transport Layer 14)

The first hole transport layer 14 contains a semiconductor. Examples of the semiconductor include organic and inorganic p-type semiconductors. The first hole transport layer 14 is formed of, for example, an inorganic material. The first hole transport layer 14 may contain a plurality of organic or inorganic p-type semiconductors. The band gap of the first hole transport layer 14 is larger than 3.0 eV.

When the first photoelectric conversion layer 3 contains a perovskite material, the p-type inorganic semiconductor usable for the first hole transport layer 14 is, for example, Ni oxide or W oxide. Specifically, $Ni_2O_3$ may be used.

Specific examples of the p-type organic semiconductor include $N^2,N^2,N^{2'},N^{2'},N^7,N^7,N^{7'},N^{7'}$-octakis(4-methoxyphenyl)-9,9'-spirobi[9H-fluorene]-2,2',7,7'-tetramine (Spiro-OMeTAD) and poly(triallylamine) (PTAA). By doping the organic semiconductor with 4-tert-butylpyridine or lithium bis(trifluoromethanesulfonyl)imide (LiTFSI), the electrical conductivity of the organic semiconductor can be increased.

To facilitate the formation of the first photoelectric conversion layer 3, the thickness of the first hole transport layer 14 may be slightly larger than the thickness of the first photoelectric conversion layer 3. The thickness of the first hole transport layer 14 may be equal to or more than 150 nm and equal to or less than 1000 nm.

(Second Electron Transport Layer 15)

When the second photoelectric conversion layer 9 contains a perovskite material, the structure of the second electron transport layer 15 may be the same as or different from the structure of the first electron transport layer 13. The second electron transport layer 15 is formed of, for example, an inorganic material. To facilitate the formation of the second photoelectric conversion layer 9, the thickness of the second electron transport layer 15 may be slightly larger than the thickness of the second photoelectric conversion layer 9. The thickness of the second electron transport layer 15 may be equal to or more than 150 nm and equal to or less than 1000 nm.

When the second photoelectric conversion layer 9 contains an n-type silicon single crystal, the second electron transport layer 15 used may be a silicon layer doped with phosphorus (P). When such a silicon layer is used for the second electron transport layer 15, the second electron transport layer 15 can be formed by a CDV method.

(Second Hole Transport Layer 16)

When the second photoelectric conversion layer 9 contains a perovskite material, the structure of the second hole transport layer 16 may be the same as or different from the structure of the first hole transport layer 14. The second hole transport layer 16 is formed of, for example, an inorganic material. To facilitate the formation of the second photoelectric conversion layer 9, the thickness of the second hole transport layer 16 may be slightly larger than the thickness of the second photoelectric conversion layer 9. The thickness of the second hole transport layer 16 may be equal to or more than 150 nm and equal to or less than 1000 nm.

When the second photoelectric conversion layer 9 contains an n-type silicon single crystal, a silicon layer doped with boron (B) may be used for the second hole transport layer 16. When such a silicon layer is used for the second hole transport layer 16, the second hole transport layer 16 can be formed by a CVD method.

The solar cell 300 can be produced by, for example, the following method.

First, the top cell 310 of the solar cell 300 is produced.

An inorganic particle paste for the first electron transport layer 13 is applied to the second substrate 5. Examples of the application method include screen printing, inkjet printing, a doctor blade method, a bar coating method, and a spraying method. The second substrate 5 coated with the first electron transport layer 13 is fired in an electric furnace at about 500° C. Next, an inorganic particle paste for the first hole transport layer 14 is applied to the second substrate 5. Examples of the application method include screen printing, ink jet printing, a doctor blade method, a bar coating method, and a spraying method. The second substrate 5 coated with the first hole transport layer 14 is fired in an electric furnace at about 500° C. No particular limitation is imposed on the order of forming the first electron transport layer 13 and the first hole transport layer 14. Among the first electron transport layer 13 and the first hole transport layer 14, one having a higher firing temperature may be first formed.

Next, the first photoelectric conversion layer 3 is formed on the second substrate 5. First, $PbI_2$ and $CH_3NH_3I$ (methylammonium Iodide: MAI) in a molar amount equal to the molar amount of $PbI_2$ are added to an organic solvent to prepare a perovskite precursor solution. The organic solvent used is, for example, a solvent mixture of dimethyl sulfoxide (DMSO): N,N-dimethylformamide (DMF)=1:1.

The first photoelectric conversion layer 3 can be formed, for example, by applying the perovskite precursor solution. The perovskite precursor solution is applied between the first electron transport layer 13 and the first hole transport layer 14. Examples of the application method include screen printing, inkjet printing, a doctor blade method, a bar coating method, and a spraying method. To form the first photoelectric conversion layer 3, toluene may be added dropwise to the perovskite precursor solution in order to facilitate nucleation. The glass substrate coated with the perovskite precursor solution is fired on a hot plate at 100° C. for 30 minutes, and a $CH_3NH_3PbI_3$ film having the perovskite structure is thereby obtained.

Next, the first negative electrode 2 and the first positive electrode 4 are deposited on the second substrate 5 by vacuum deposition. Any of the first negative electrode 2 and the first positive electrode 4 may be deposited first.

Specifically, aluminum (Al) is evaporated onto the second substrate 5 to form the first negative electrode 2. Gold (Au) is evaporated onto the second substrate 5 to form the first positive electrode 4.

A glass substrate serving as the first substrate 1 is stacked on the second substrate 5 with the first negative electrode 2, the first photoelectric conversion layer 3, the first positive electrode 4, the first electron transport layer 13, and the first hole transport layer 14 formed thereon. The first negative electrode 2, the first photoelectric conversion layer 3, the first positive electrode 4, the first electron transport layer 13, and the first hole transport layer 14 disposed between the first substrate 1 and the second substrate 5 are sealed with an epoxy resin. Then the epoxy resin is cured with UV light to produce the top cell 310.

Next, the bottom cell 320 of the solar cell 300 is produced.

When the second photoelectric conversion layer 9 contains a perovskite material, the second photoelectric conversion layer 9 may be formed by the same method as that for the first photoelectric conversion layer 3.

When the second photoelectric conversion layer 9 contains an n-type silicon single crystal, the bottom cell components can be produced by vapor deposition, a sputtering method, a CVD method, etc. For example, a multilayer body in which the components of the bottom cell 320 are stacked is produced. Specifically, the second negative electrode 8, the second electron transport layer 15, the second photoelectric conversion layer 9, the second hole transport layer 16, and the second positive electrode 10 are formed in this order. Then the multilayer body is cut, for example, at 1 mm intervals, and the bottom cell components are thereby produced.

The method for forming the second electron transport layer 15 may be the same as the method for forming the first electron transport layer 13. The method for forming the second hole transport layer 16 may be the same as the method for forming the first hole transport layer 14.

In the present embodiment, the electron transport layers and the hole transport layers are formed of, for example, inorganic materials. Each of the electron transport layers and the hole transport layers may be formed by applying an inorganic particle paste to a substrate. Therefore, when the electron transport layers and the hole transport layers are produced, the photoelectric conversion layers containing the respective perovskite materials are unlikely to be damaged. Moreover, the electron transport layers and the hole transport layers are produced by firing at a high temperature of about 500° C. Therefore, the tandem solar cell provided has high heat resistance and high light resistance.

Embodiment 4

Figure 4A:
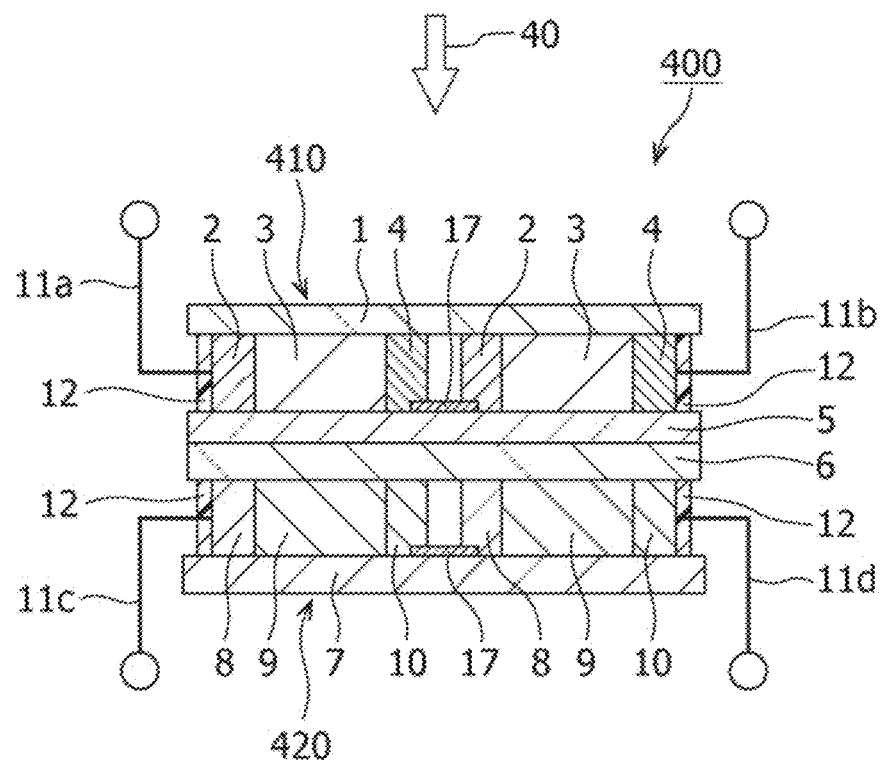
FIG. 4A is a cross-sectional view of a solar cell according to embodiment 4.
Figure 4B:
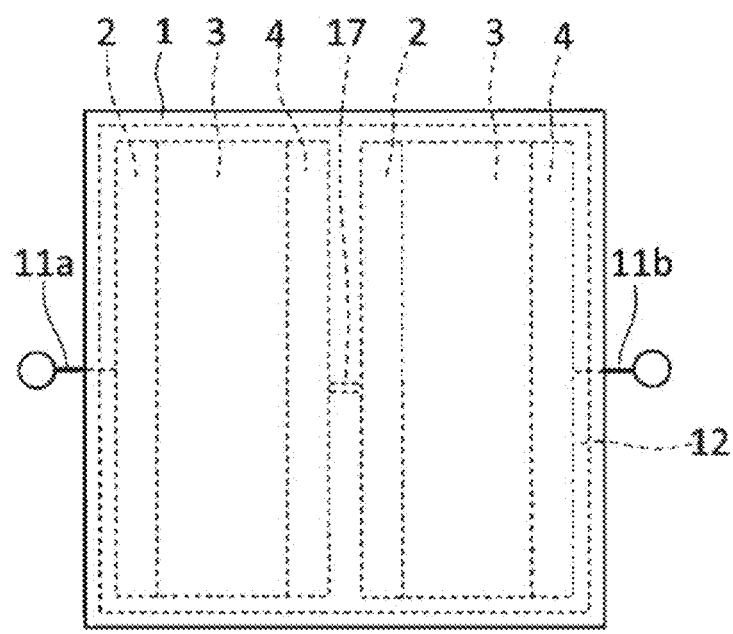
FIG. 4B is a top view of the solar cell according to embodiment 4.

FIG. 4A is a cross-sectional view of a solar cell 400 according to embodiment 4. FIG. 4B is a top view of the solar cell 400 according to embodiment 4.

As shown in FIG. 4A, the solar cell 400 includes a top cell 410 and a bottom cell 420, and the top cell 410 and the bottom cell 420 each include two elements. In the top cell 410, a first positive electrode 4 of a first one of the elements and a first negative electrode 2 of a second one of the elements are electrically connected through a terminal 17. In the bottom cell 420, a second positive electrode 10 of a first one of the elements and a second negative electrode 8 of a second one of the elements are electrically connected through a terminal 17. With the above structure, the solar cell produced can have a large area.

In the solar cell 400, the top cell 410 and the bottom cell 420 include the same number of elements. The number of elements included in the top cell 410 may be the same as or different from the number of elements included in the bottom cell 420. An insulating layer may be disposed between the first one and second one of the elements in the top cell 410, for the purpose of preventing a short circuit and improving the accuracy of patterning. Moreover, an insulating layer may be disposed between the first one and second one of the elements in the bottom cell 420, for the purpose of preventing a short circuit and improving the accuracy of patterning.

In the solar cell 400, each of the elements in the top cell 410 may further include a first electron transport layer 13 and a first hole transport layer 14. Each of the elements in the bottom cell 420 may further include a second electron transport layer 15 and a second hole transport layer 16. With the above structure, the photoelectric conversion efficiency can be improved.

Embodiment 5

Figure 5A:
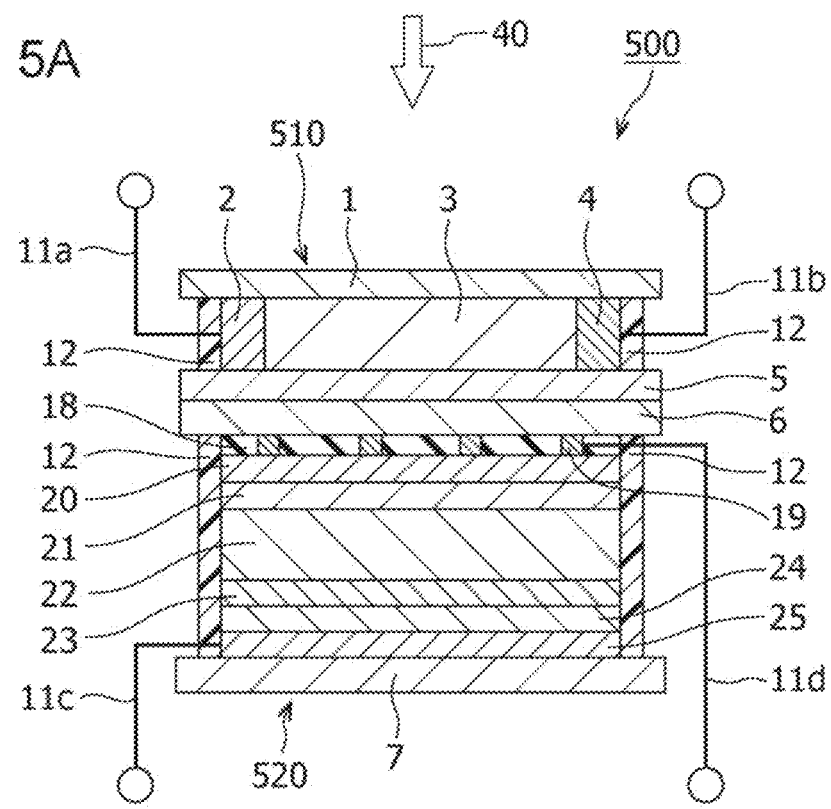
FIG. 5A is a cross-sectional view of a solar cell according to embodiment 5.
Figure 5B:
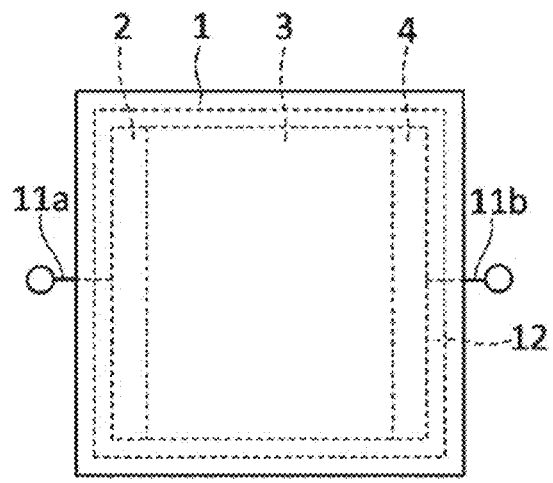
FIG. 5B is a top view of a top cell of the solar cell according to embodiment 5.
Figure 5C:
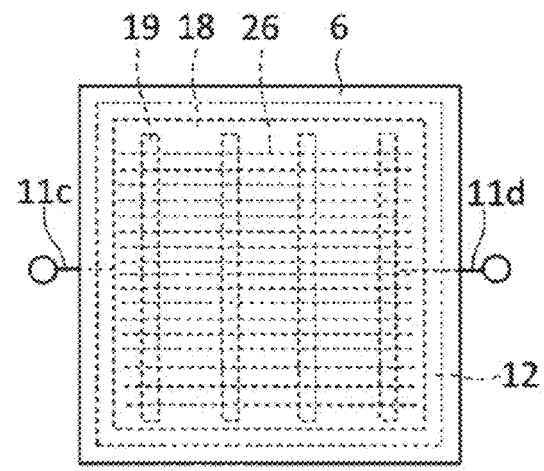
FIG. 5C is a top view of a bottom cell of the solar cell according to embodiment 5.

FIG. 5A is a cross-sectional view of a solar cell 500 according to embodiment 5. FIG. 5B is a top view of a top cell 510 of the solar cell 500 according to embodiment 5. FIG. 5C is a top view of a bottom cell 520 of the solar cell 500 according to embodiment 5.

As shown in FIG. 5A, in the solar cell 500, a top cell 510 has the same structure as the structure of the top cell 110. However, the top cell 510 may further include a first electron transport layer 13 and a first hole transport layer 14. With the above structure, the photoelectric conversion efficiency can be improved.

The bottom cell 520 is a silicon solar cell having surface electrodes. The bottom cell 520 includes a second substrate 6, a third substrate 7, a protective film 18, second positive electrodes 19, second positive electrodes 26, a second hole transport layer 20, a second hole transport layer 21, a second photoelectric conversion layer 22, a second electron transport layer 23, a second electron transport layer 24, and a second negative electrode 25.

The second positive electrodes 19 and the second positive electrodes 26 are disposed between the second substrate 6 and the second photoelectric conversion layer 22. More specifically, the second hole transport layer 22 is disposed on the second photoelectric conversion layer 21. The second hole transport layer 20 is disposed on the second hole transport layer 21. The second positive electrodes 19, the second positive electrodes 26, and the protective film 18 are disposed on the second hole transport layer 20. The second substrate 6 is disposed on the second positive electrodes 19 and 26.

The second negative electrode 25 is disposed between the third substrate 7 and the second photoelectric conversion layer 22. More specifically, the second negative electrode 25 is disposed on the third substrate 7. The second electron transport layer 24 is disposed on the second negative electrode 25. The second electron transport layer 23 is disposed on the second electron transport layer 24. The second photoelectric conversion layer 22 is disposed on the second electron transport layer 23.

A plurality of busbar electrodes 19 and a plurality of finger electrodes 26 used as the second positive electrodes are disposed on the front surface of the bottom cell 520. In this structure, although the positive electrodes are disposed on the front surface of the bottom cell 520, light is allowed to pass through to the photoelectric conversion layer efficiently. In the bottom cell 520, for the purpose of reducing the sheet resistance on the negative electrode side, busbar electrodes and finger electrodes may be disposed between the second negative electrode 25 and the third substrate 7.

In the present specification, "the protective film 18, the second positive electrodes 19, the second positive electrodes 26, the second hole transport layer 20, the second hole transport layer 21, the second photoelectric conversion layer 22, the second electron transport layer 23, the second electron transport layer 24, and the second negative electrode 25" may be referred to as a "front surface electrode-type element."

(Second Photoelectric Conversion Layer 22)

The second photoelectric conversion layer 22 is an n-type silicon layer. The second photoelectric conversion layer 22 used may be an n-type single crystal silicon substrate doped with phosphorus (P).

(Second Hole Transport Layer 21)

The second hole transport layer 21 is an i-type amorphous silicon layer. The second hole transport layer 21 can be produced by forming a silicon layer on the second photoelectric conversion layer 22 using a CVD method.

(Second Hole Transport Layer 20)

The second hole transport layer 20 is a p-type amorphous silicon layer. The second hole transport layer 20 is produced by forming a silicon layer doped with boron (B: boron) on the second hole transport layer 21 using a CVD method.

(Second Positive Electrodes 19 and 26)

The second electrodes are disposed on the front surface of the bottom cell 520. The second electrodes include the plurality of busbar electrodes 19 and the plurality of finger electrodes 26. The plurality of busbar electrodes 19 extending parallel to each other and the plurality of finger electrodes 26 orthogonal to the busbar electrodes 19 are disposed on the front surface of the bottom cell 520. The plurality of busbar electrodes 19 are electrically connected to each of the plurality of finger electrodes 26. The plurality of busbar electrodes 19 are electrically connected to each other through the plurality of finger electrodes 26.

The busbar electrodes 19 each have, for example, a rectangular shape in plan view. No particular limitation is imposed on the number of busbar electrodes 19 disposed for one front surface electrode-type element, and the number of busbar electrodes 19 is, for example, 4. No particular limitation is imposed on the width of the busbar electrodes 19, and the width may be from 0.5 mm to 2 mm. No particular limitation is imposed on the separation distance between the plurality of busbar electrodes 19, and the separation distance may be from 25 mm to 50 mm. The finger electrodes 26 each have, for example, a rectangular shape in plan view. No particular limitation is imposed on the width of the finger electrodes 26, and the width may be from 0.05 mm to 0.1 mm. No particular limitation is imposed on the separation distance between the plurality of finger electrodes 26, and the separation distance may be from 0.3 mm to 0.6 mm. In the solar cell 400 in the present embodiment, the busbar electrodes 19 and the finger electrodes 26 are disposed on the front surface, i.e., the light-receiving surface, of the bottom cell 520.

The busbar electrodes 19 and the finger electrodes 26 are produced by applying a Ag paste. The busbar electrodes 19 and the finger electrodes 26 may also be produced by vapor deposition of Ag.

The busbar electrodes 19 and the finger electrodes 26 may have light-transmitting properties. The busbar electrodes 19 and the finger electrodes 26 may be produced by forming transparent electrodes made of, for example, ITO instead of Ag by sputtering. By using the transparent electrodes made of, for example, ITO, the power generation area can be increased.

(Protective Film 18)

The protective film 18 protects the front surface of the bottom cell 520. The protective film 18 may serve also as an antireflective film. The protective film 18 is, for example, a silicon nitride film. The protective film 18 is produced by forming a SiN$_3$ layer by a CVD method.

(Second Electron Transport Layer 23)

The second electron transport layer 23 is an i-type amorphous silicon layer. The second electron transport layer 23 is disposed on a surface of the second photoelectric conversion layer 22 that is opposite to the second hole transport layer 21. The second electron transport layer 23 is produced by forming a silicon layer by a CVD method.

(Second Electron Transport Layer 24)

The second electron transport layer 24 is an n-type amorphous silicon layer. The second electron transport layer 24 is produced by forming a silicon layer doped with phosphorus (P) on the second electron transport layer 23 by a CVD method.

(Second Negative Electrode 25)

The second negative electrode 25 is produced by applying an Al paste. The second negative electrode 25 may also be produced by vapor deposition of Al. The second negative electrode 25 may be produced by forming a transparent electrode made of ITO instead of Al by sputtering.

Embodiment 6

Figure 6A:
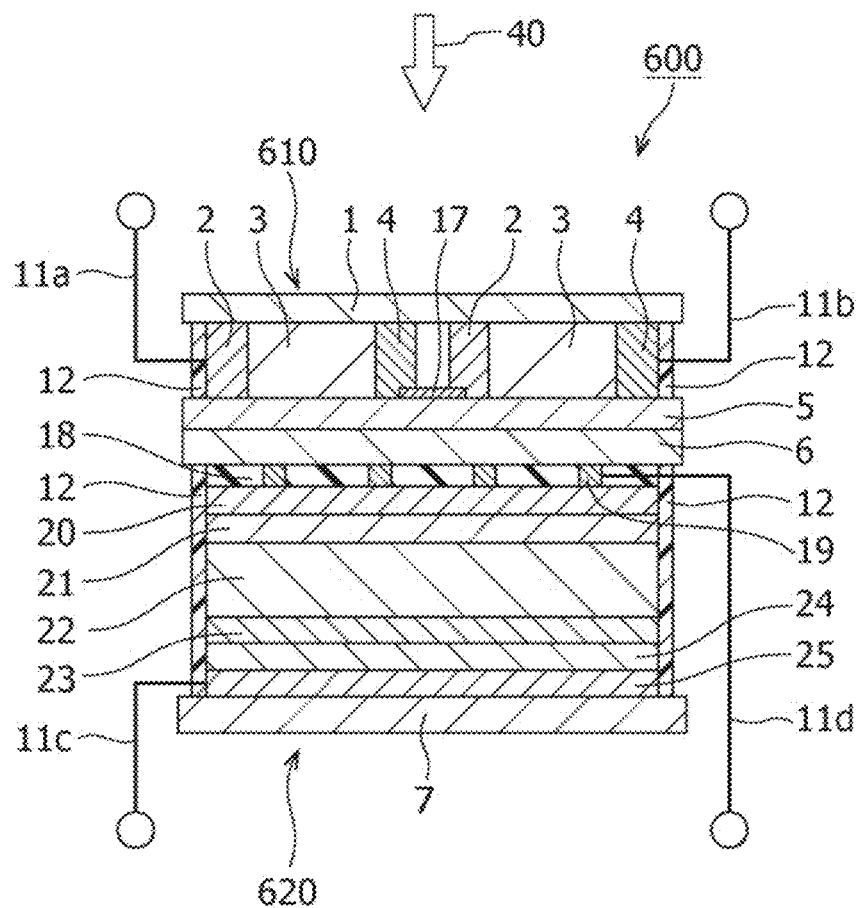
FIG. 6A is a cross-sectional view of a solar cell according to embodiment 6.
Figure 6B:
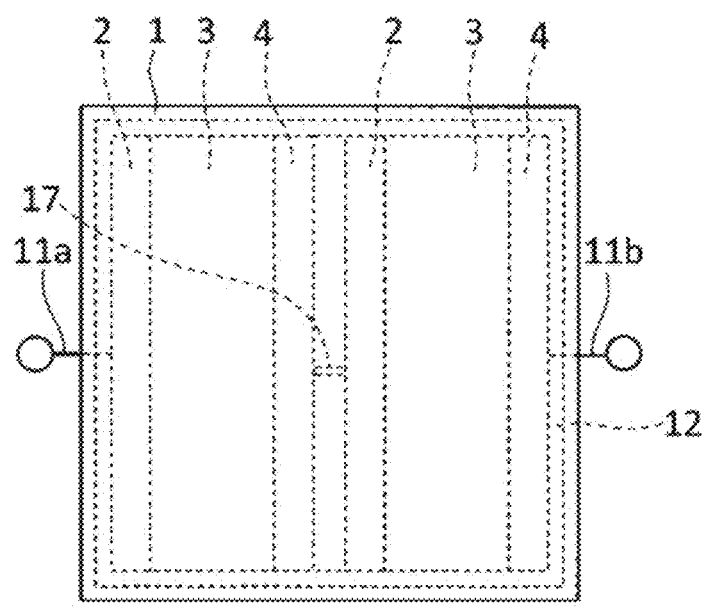
FIG. 6B is a top view of the solar cell according to embodiment 6.

FIG. 6A is a cross-sectional view of a solar cell 600 according to embodiment 6. FIG. 6B is a top view of the solar cell 600 according to embodiment 6.

As shown in FIG. 6A, a top cell 610 has the same structure as the structure of the top cell 410. A bottom cell 620 has the same structure as the structure of the bottom cell 520. As shown in FIG. 6A, the top cell 610 includes 2 elements. However, no particular limitation is imposed on the number of elements included in the top cell 610. By appropriately setting the number of elements included in the top cell 610, the moving distance of carriers in the first photoelectric conversion layer 3 of each element can be shortened. Therefore, the occurrence of recombination of the carriers in the first photoelectric conversion layer 3 of each element can be reduced. Moreover, since the top cell 610 includes the plurality of elements, a large area solar cell having, for example, a square shape with a side length of about 10 cm can be produced.

Each of the elements in the top cell 610 may further include a first electron transport layer 13 and a first hole transport layer 14. With this structure, the photoelectric conversion efficiency can be improved.

Embodiment 7

Figure 7A:
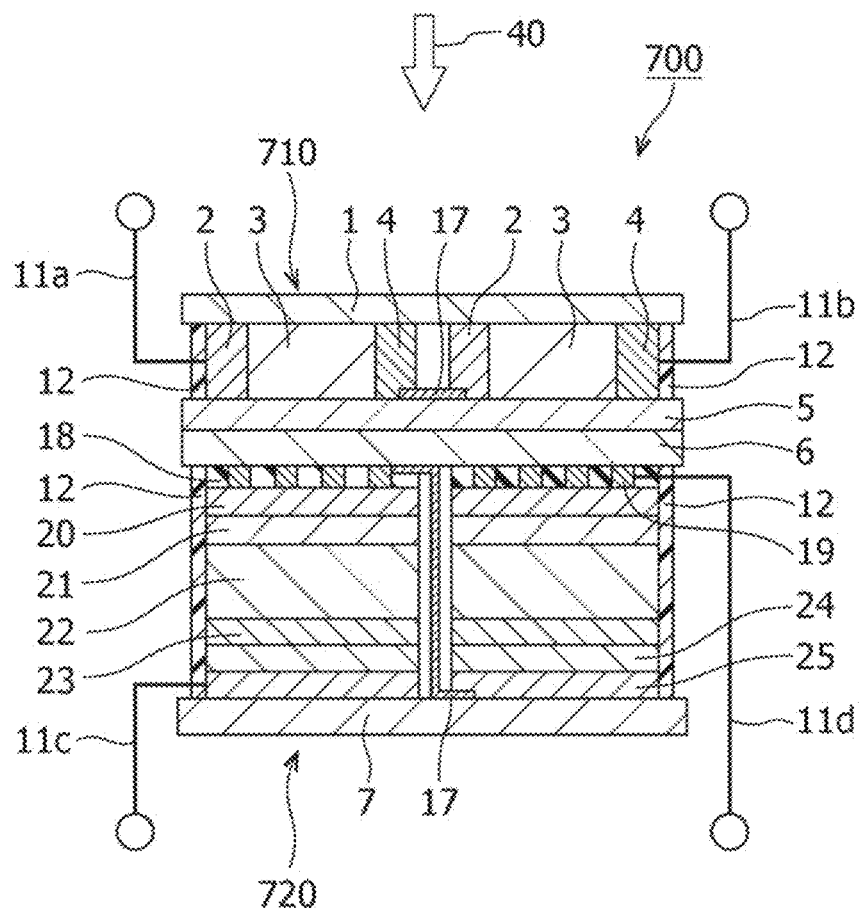
FIG. 7A is a cross-sectional view of a solar cell according to embodiment 7.
Figure 7B:
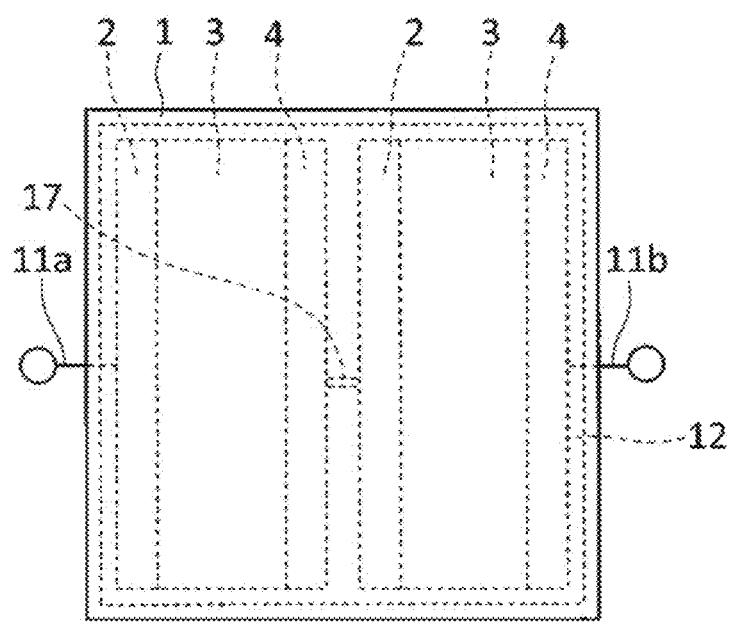
FIG. 7B is a top view of the solar cell according to embodiment 7.

FIG. 7A is a cross-sectional view of a solar cell 700 according to embodiment 7. FIG. 7B is a top view of the solar cell 700.

As shown in FIG. 7A, a top cell 710 has the same structure as the structure of the top cell 610. A bottom cell 720 includes two front surface electrode-type elements. In the front surface electrode-type elements provided in the bottom cell 720, the second positive electrodes 19 and 26 included in a first one of the front surface electrode-type elements are electrically connected to the second negative electrode 25 included in a second one of the front surface electrode-type elements through a terminal 17. With the above structure, a large area solar cell having, for example, a square shape with a side length equal to or more than 10 cm can be produced.

In the solar cell 700, the top cell 710 and the bottom cell 720 include the same number of elements. However, the number of elements included in the top cell 710 may be the same as or different from the number of elements included in the bottom cell 720. An insulating layer may be disposed between the first one of the elements in the top cell 710 and the second one of the elements, for the purpose of preventing a short circuit and improving the accuracy of patterning. An insulating layer may be disposed between the first one of the elements in the bottom cell 720 and the second one of the elements, for the purpose of preventing a short circuit and improving the accuracy of patterning.

Each of the elements in the top cell 710 may further include a first electron transport layer 13 and a first hole transport layer 14. With this structure, the photoelectric conversion efficiency can be improved.

Embodiment 8

Figure 8A:
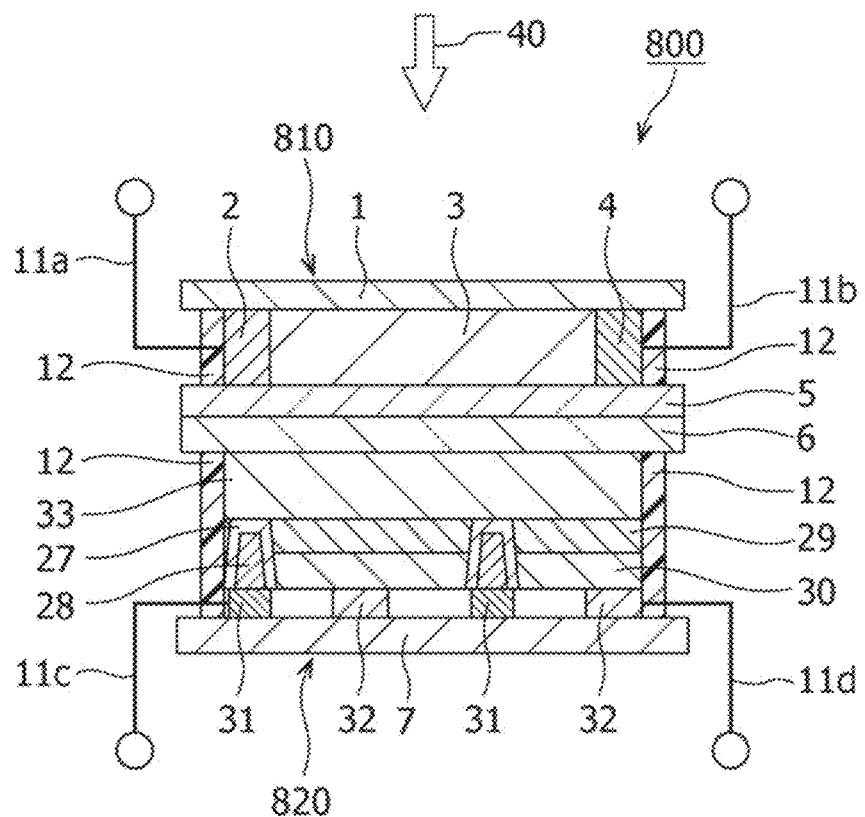
FIG. 8A is a cross-sectional view of a solar cell according to embodiment 8.
Figure 8B:
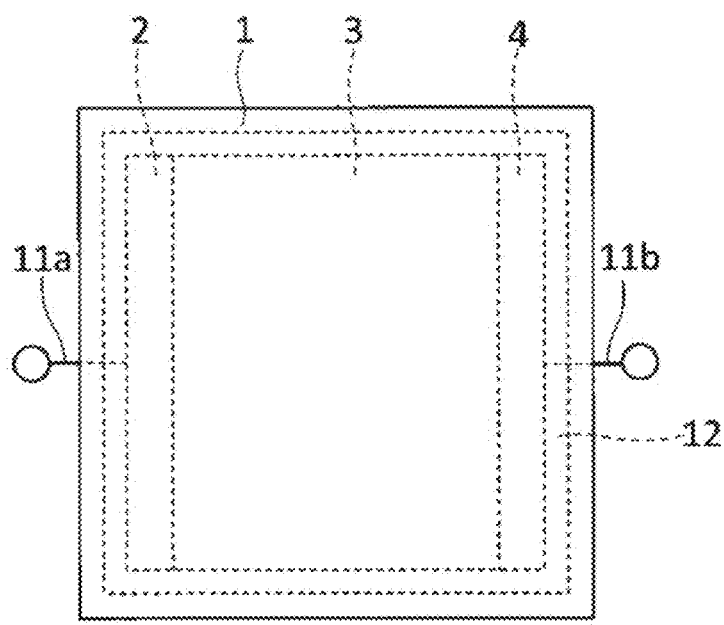
FIG. 8B is a top view of the solar cell according to embodiment 8.

FIG. 8A is a cross-sectional view of a solar cell 800 according to embodiment 8. FIG. 8B is a top view of the solar cell 800 according to embodiment 8.

As shown in FIG. 8A, a top cell 810 of the solar cell 800 has the same structure as the structure of the top cell 110. However, the top cell 810 may further include a first electron transport layer 13 and a first hole transport layer 14. With this structure, the photoelectric conversion efficiency can be improved.

A bottom cell 820 is a silicon solar cell of the back contact type having back side electrodes. The bottom cell 820 include a second substrate 6, a third substrate 7, a second photoelectric conversion layer 33, a second hole transport layer 27, a second hole transport layer 28, a second electron transport layer 29, a second electron transport layer 30, second positive electrodes 31, and second negative electrodes 32. The second positive electrodes 31 are disposed between the third substrate 7 and the second photoelectric conversion layer 33. The second negative electrodes 32 are disposed between the third substrate 7 and the second photoelectric conversion layer 33. More specifically, the second positive electrodes 31 and the second negative electrodes 32 are disposed on the third substrate 7. The second positive electrodes 31 and the second negative electrodes 32 are arranged alternately in a direction perpendicular to the arrangement direction of the first substrate 1, the second substrate 5, the second substrate 6, and the third substrate 7. The second positive electrodes 31 and the second negative electrodes 32 are electrically isolated from each other with gaps therebetween. The second electron transport layer 30, the second electron transport layer 29, the second photoelectric conversion layer 33, and the second substrate 6 are stacked in this order on the second negative electrodes 32. The second hole transport layers 27 and 28 are disposed on the second positive electrodes 31.

In the present specification, "the second photoelectric conversion layer 33, the second hole transport layer 27, the second hole transport layer 28, the second electron transport layer 29, the second electron transport layer 30, the second positive electrodes 31, and the second negative electrodes 32" may be referred to as a "back contact-type element."

The distance between the second positive electrodes 31 and the second negative electrodes 32 can be determined from the carrier diffusion length in the second photoelectric conversion layer 33. When the second photoelectric conversion layer 33 contains an n-type silicon single crystal, the carrier diffusion length in the second photoelectric conversion layer 33 is about 100 μm. The distance between the electrodes can be set to be about 10 times the carrier diffusion length. Therefore, the distance between the second positive electrodes 31 and the second negative electrodes 32 may be equal to or more than 0.1 mm and equal to or less than 1 mm.

The back contact-type silicon solar cell has no electrodes on its light-receiving surface. Therefore, the power generation area of the bottom cell 820 is larger than those of the front surface electrode-type solar cells. In the above structure, the light transmittance of the bottom cell 820 is unlikely to decrease, so that the photoelectric conversion efficiency can be improved.

(Second Photoelectric Conversion Layer 33)

The second photoelectric conversion layer 33 is an n-type silicon layer. The second photoelectric conversion layer 33 used may be an n-type single crystal silicon substrate doped with phosphorus (P).

(Second Electron Transport Layer 29)

The second electron transport layer 29 is an i-type intrinsic amorphous silicon layer. The second electron transport layer 29 is produced by forming a silicon layer on the second photoelectric conversion layer 33 by a CVD method.

(Second Electron Transport Layer 30)

The second electron transport layer 30 is an n-type amorphous silicon layer. The second electron transport layer 30 is produced by forming a silicon layer doped with phosphorus (P) on the second electron transport layer 29 by a CVD method.

(Second Hole Transport Layer 27)

The second hole transport layer 27 is an i-type intrinsic amorphous silicon layer. To form the second hole transport layer 27, first, grooves separated from each other by a distance of about 2 mm are formed by removing part of the second electron transport layer 29 and part of the second electron transport layer 30 by etching. Then a silicon layer is formed in the grooves by a CVD method to thereby form the second hole transport layer 27.

(Second Hole Transport Layer 28)

The second hole transport layer 28 is a p-type amorphous silicon layer. The second hole transport layer 28 can be produced by forming a silicon layer doped with boron (B) on the second hole transport layer 27 by a CVD method.

(Second Positive Electrodes 31)

The second positive electrodes 31 are formed by applying a Ag paste on the second hole transport layer 28. To form the second positive electrodes 31, a mask may be formed on the second electron transport layer 30 in advance, and Ag may be evaporated thereonto.

(Second Negative Electrodes 32)

The second negative electrodes 32 are formed by forming a mask on the second positive electrodes 31 in advance and then evaporating Al thereonto.

Embodiment 9

Figure 9A:
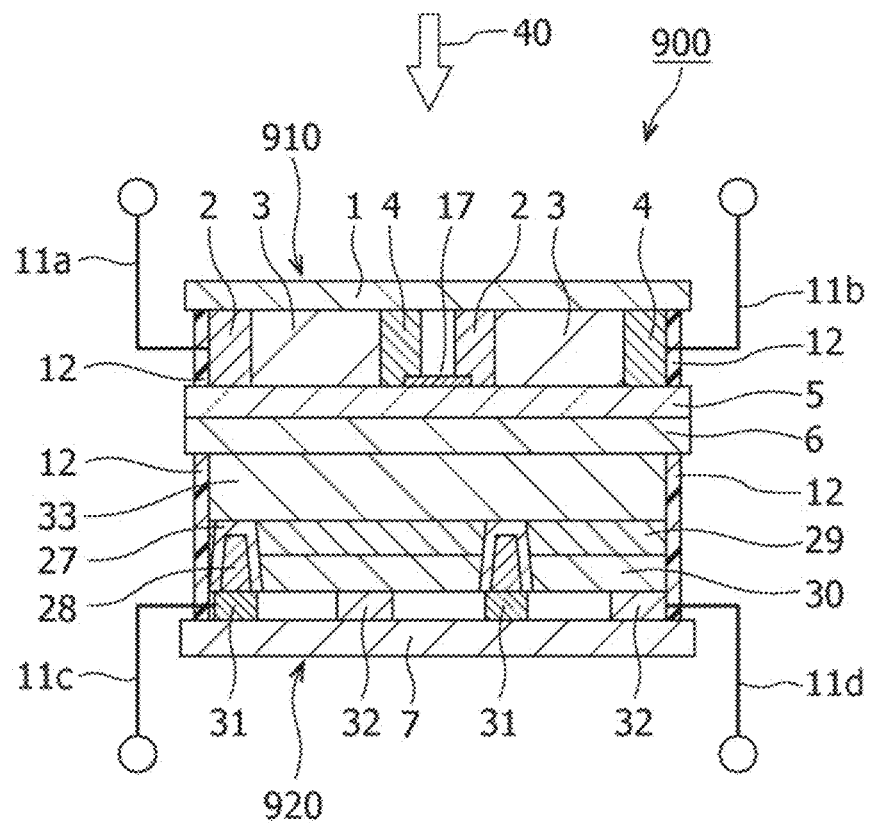
FIG. 9A is a cross-sectional view of a solar cell according to embodiment 9.
Figure 9B:
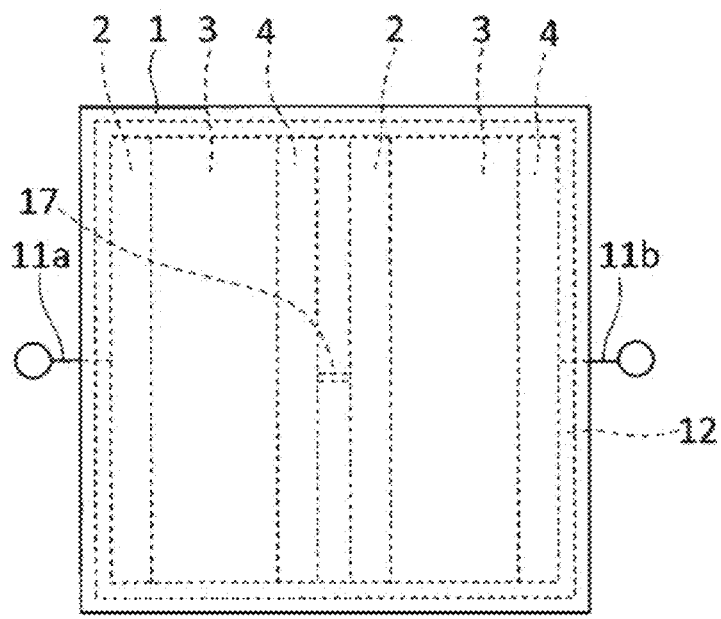
FIG. 9B is a top view of the solar cell according to embodiment 9.

FIG. 9A is a cross-sectional view of a solar cell 900 according to embodiment 9. FIG. 9B is a top view of the solar cell 900.

As shown in FIG. 9A, a top cell 910 has the same structure as the structure of the top cell 410. A bottom cell 920 has the same structure as the structure of the bottom cell 820. As shown in FIG. 9A, the top cell 910 includes two elements. However, no particular limitation is imposed on the number of elements included in the top cell 910. By appropriately setting the number of elements included in the top cell 910, the moving distance of carriers in the first photoelectric conversion layer 3 of each element can be shortened. Therefore, the occurrence of recombination of the carriers in the first photoelectric conversion layer 3 of each element can be reduced. Moreover, since the top cell 910 includes the plurality of elements, a large area solar cell having, for example, a square shape with a side length of about 10 cm can be produced.

Each of the elements in the top cell 910 may further include a first electron transport layer 13 and a first hole transport layer 14. With this structure, the photoelectric conversion efficiency can be improved.

Embodiment 10

Figure 10A:
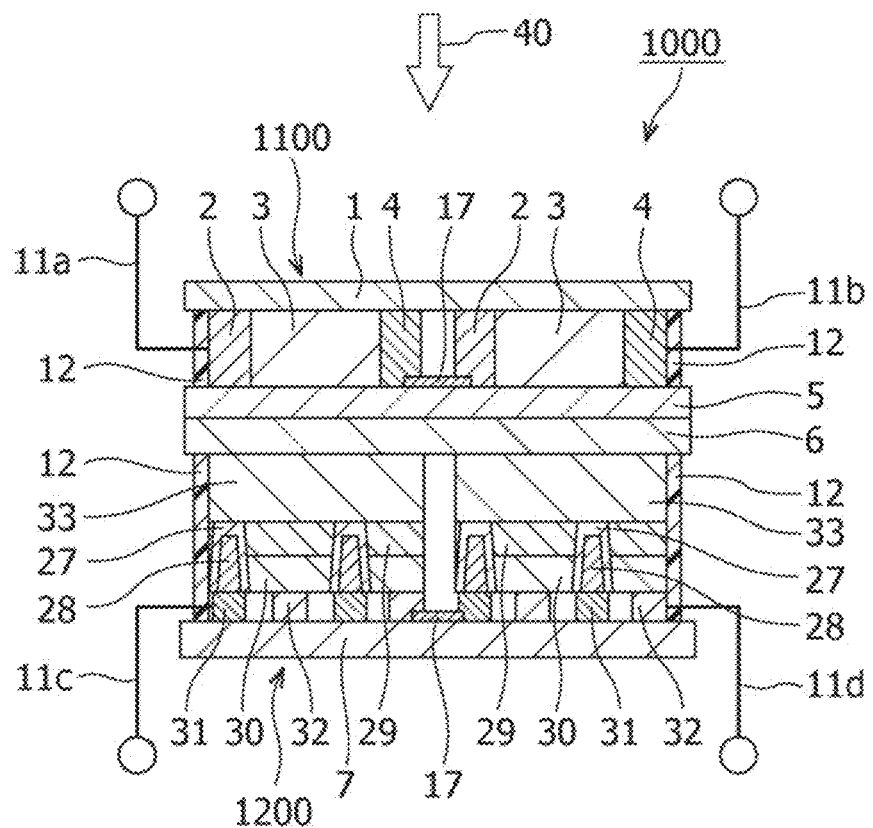
FIG. 10A is a cross-sectional view of a solar cell according to embodiment 10.
Figure 10B:
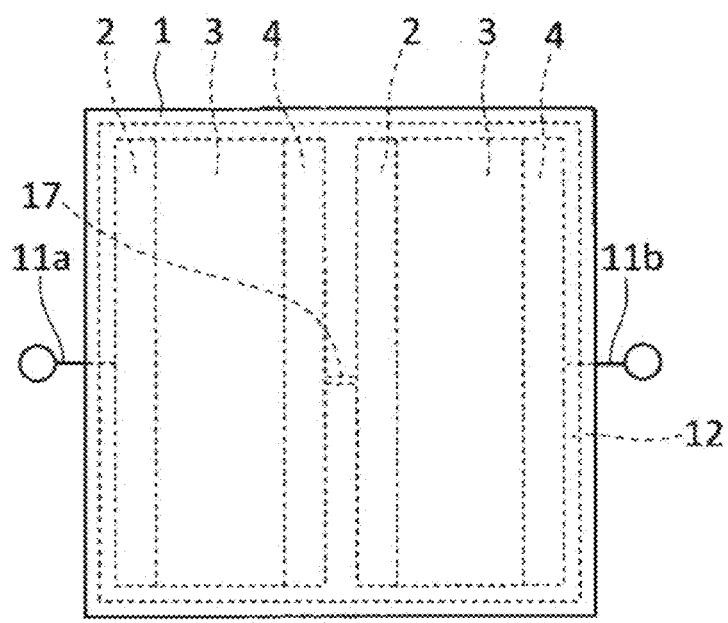
FIG. 10B is a top view of the solar cell according to embodiment 10.

FIG. 10A is a cross-sectional view of a solar cell 1000 according to embodiment 10. FIG. 10B is a top view of the solar cell 1000 according to embodiment 10.

As shown in FIG. 10A, a top cell 1100 has the same structure as the structure of the top cell 910. A bottom cell 1200 includes two back contact-type elements. In the back contact-type elements in the bottom cell 1200, a second positive electrode 31 of a first one of the back contact-type elements is electrically connected to a second negative electrode 32 of a second one of the back contact-type elements through a terminal 17. With this structure, the solar cell produced can have a large area. With the above structure, while a reduction in light transmittance is prevented, the occurrence of recombination of carriers can be reduced. Since the bottom cell 1200 includes the plurality of elements, a large area solar cell having, for example, a square shape with a side length equal to or more than 10 cm can be produced.

In the solar cell 1000, the top cell 1100 and the bottom cell 1200 include the same number of elements. However, the number of elements included in the top cell 1110 may be the same as or different from the number of elements included in the bottom cell 1200. An insulating layer may be disposed between the first one of the elements of the top cell 1100 and the second one of the elements, for the purpose of preventing a short circuit and improving the accuracy of patterning. An insulating layer may be disposed between the first one of the elements of the bottom cell 1200 and the second one of the elements, for the purpose of preventing a short circuit and improving the accuracy of patterning.

Each of the elements of the top cell 1100 may further include a first electron transport layer 13 and a first hole transport layer 14. With this structure, the photoelectric conversion efficiency can be improved.

The structures of the four-terminal tandem solar cells in embodiments 1 to 10 are shown in Table 1. The "non-transparent electrodes" in Table 1 mean electrode that do not use a metal-doped inorganic oxide. Examples of the non-transparent electrodes include electrodes formed of metals and layered carbon materials. Examples of the layered carbon materials include graphene with no band gap. The cell structure in the "present disclosure" means a structure in which a pair of electrodes are disposed so as to sandwich a photoelectric conversion layer therebetween in a direction perpendicular to the arrangement direction of the first substrate, the second substrate, and the third substrate.

(Optical Simulations of Tandem Solar Cell Having Three Transparent Electrodes)

Figure 11A:
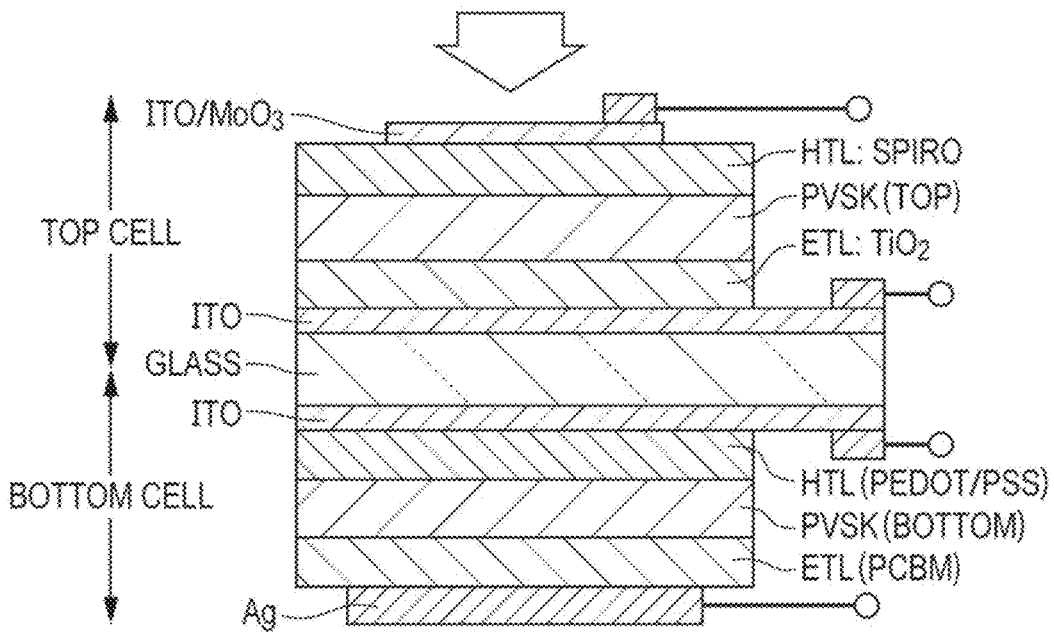
FIG. 11A shows the structure of a conventional four-terminal tandem solar cell used for optical simulations.

A solar cell simulator e-ARC (provided by National Research and Development Agency National Institute of Advanced Industrial Science and Technology) was used to compute the optical characteristics of a tandem solar cell having three transparent electrodes (i.e., a conventional four-terminal tandem solar cell, see FIG. 11A).

First, the thicknesses of the following layers and the quality parameters of light absorption layers were inputted to the solar cell simulator e-ARC. The quality parameters of each light absorption layer include the refractive indexes n at different wavelengths and the extinction coefficients k at different wavelengths.

1. Thicknesses or Layers

[Top Cell]
  First ITO: 500 nm
  $MoO_3$: 20 nm
  Spiro-OMeTAD: 100 nm
  $FAPbI_3$: 500 nm
  $TiO_2$: 15 nm
  Second ITO: 100 nm
  Glass: 500000 nm

[Bottom Cell]
  Third ITO: 100 nm
  PEDOT/PSS: 50 nm
  $(MAFA)(PbSn)I_3$: 500 nm
  PCBM: 30 nm
  Ag: 100 nm 2. Quality Parameters of Light Absorption Layers The following three documents were referenced to determine the values of the refractive indexes n and extinction coefficients k per 1 nm of each layer.

[1] H. Fujiwara, R. W. Collins, editors, Spectroscopic Ellipsometry for Photovoltaics: Vol. 2 Springer (2018)

[2] J. Werner et al., ACS Energy Lett. 3, 742 (2018)

[3] Maximilian T. Hoerantner et al., ACS Energy Lett. 2, 2506 (2017)

Then the amount of reflection and the amount of absorption by each layer were outputted from the solar cell simulator e-ARC.

Then the amount of reflection and the amount of absorption by each layer were used to compute external quantum efficiency (i.e., EQE) and the amount of absorption.

Figure 11B:
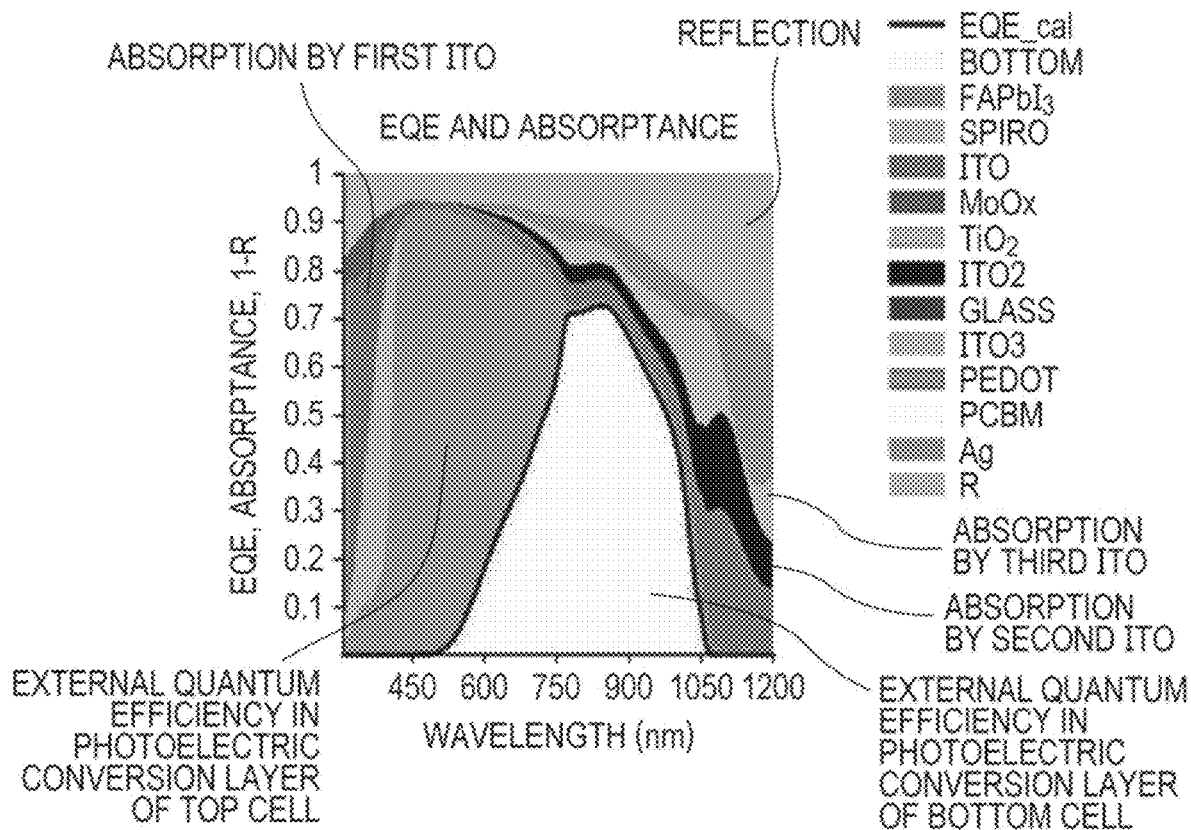
FIG. 11B shows the results of the optical simulations (the horizontal axis: wavelength, the vertical axis: external quantum efficiency).

Table 2 shows the layers and the amount of absorption by each layer (i.e., the value of current loss). FIG. 11B shows wavelength (the horizontal axis) versus the external quantum efficiency (i.e., EQE: the vertical axis).

TABLE 1

| Embodiment | | Type of electrodes | Cell structure | Photoelectric conversion material | Materials usable for electron transport layers and hole transport layers | Number of transparent electrodes |
|---|---|---|---|---|---|---|
| 1-4 | Top cell | Non-transparent electrodes | Present disclosure | Perovskite material | No limitation or inorganic materials | 0 |
| | Bottom cell | Non-transparent electrodes | Present disclosure | Silicon material or perovskite material | No limitation or inorganic materials | |
| 5-7 | Top cell | Non-transparent electrodes | Present disclosure | Perovskite material | No limitation or inorganic materials | 0 or 1 |
| | Bottom cell | Negative electrode is non-transparent electrode | Front surface electrode | Silicon material or perovskite material | No limitation or inorganic materials | |

TABLE 1-continued

| Embodiment | | Type of electrodes | Cell structure | Photoelectric conversion material | Materials usable for electron transport layers and hole transport layers | Number of transparent electrodes |
|---|---|---|---|---|---|---|
| 8-10 | Top cell | Non-transparent electrodes | Present disclosure | Perovskite material | No limitation or inorganic materials | 0 |
| | Bottom cell | Non-transparent electrodes | Back contact | Silicon material | — | |

TABLE 2

| Layer | Amount of absorption (mA/cm$^2$) |
|---|---|
| ITO (total of three including two in top cell and one in bottom cell) | 7.646 |
| Spiro-OMeTAD | 2.825 |
| PCBM | 0.007 |
| Ag | 0.306 |

As shown in Table 1, the four-terminal tandem solar cells according to embodiments 1 to 10 use no or one transparent electrode. However, the conventional four-terminal tandem solar cell requires three transparent electrodes. In the four-terminal tandem solar cells having the structure of the present disclosure, the use of the transparent electrodes can be avoided. When the electrodes are eliminated from the light-receiving surfaces, the light transmittance is unlikely to decrease. Moreover, since the electrodes used can each be a non-transparent electrode formed of a metal material, the electrical resistance is unlikely to increase. Therefore, the power generation efficiency of the solar cells can also be improved.

As shown in FIG. 11B and Table 2, the amount of absorption by ITO, which is one type of transparent electrode, is higher than those of other layers. This amount of absorption is the value of current loss by the ITO. In the above embodiments, the number of transparent electrodes is smaller than that in the conventional four-terminal tandem solar cell. It is therefore expected to reduce the value of current loss in the solar cells.

The technique of the present disclosure is useful for four-terminal tandem solar cells.

What is claimed is:

1. A solar cell comprising:
a first substrate;
a second substrate;
a third substrate;
a first photoelectric conversion layer;
a second photoelectric conversion layer; and
a pair of electrodes,
wherein the first substrate and the second substrate have light-transmitting properties,
wherein the second substrate is disposed between the first substrate and the third substrate,
wherein the first photoelectric conversion layer is disposed between the first substrate and the second substrate,
wherein the second photoelectric conversion layer is disposed between the second substrate and the third substrate,
wherein the pair of electrodes are disposed so as to sandwich the first photoelectric conversion layer therebetween in a direction perpendicular to an arrangement direction of the first substrate, the second substrate, and the third substrate,
wherein the pair of electrodes cause an electric current to flow in the direction perpendicular to the arrangement direction of the first substrate, the second substrate, and the third substrate, and wherein
each of the pair of electrodes is defined by a single rectangular shape in cross-sectional view.

2. The solar cell according to claim 1, wherein the pair of electrodes include a first negative electrode and a first positive electrode, and
wherein the solar cell further comprises a first electron transport layer disposed between the first negative electrode and the first photoelectric conversion layer and a first hole transport layer disposed between the first positive electrode and the first photoelectric conversion layer.

3. The solar cell according to claim 2, wherein at least one selected from the group consisting of the first negative electrode and the first positive electrode is a non-transparent electrode formed of a metal material.

4. The solar cell according to claim 1, further comprising an additional pair of electrodes disposed so as to sandwich the second photoelectric conversion layer therebetween in the direction perpendicular to the arrangement direction of the first substrate, the second substrate, and the third substrate.

5. The solar cell according to claim 4, wherein the additional pair of electrodes include a second negative electrode and a second positive electrode, and
wherein the solar cell further comprises a second electron transport layer disposed between the second negative electrode and the second photoelectric conversion layer and a second hole transport layer disposed between the second positive electrode and the second photoelectric conversion layer.

6. The solar cell according to claim 5, wherein at least one selected from the group consisting of the second negative electrode and the second positive electrode is a non-transparent electrode formed of a metal material.

7. The solar cell according to claim 1, further comprising:
a second positive electrode having light-transmitting properties and disposed between the second substrate and the second photoelectric conversion layer; and
a second negative electrode disposed between the third substrate and the second photoelectric conversion layer,
wherein the second positive electrode includes a plurality of busbar electrodes and a plurality of finger electrodes, and wherein the plurality of busbar electrodes are electrically connected to each other through the plurality of finger electrodes.

8. The solar cell according to claim 1, further comprising:
second negative electrodes disposed between the third substrate and the second photoelectric conversion layer; and
second positive electrodes disposed between the third substrate and the second photoelectric conversion layer,
wherein the second negative electrodes and the second positive electrodes are arranged alternately in the direction perpendicular to the arrangement direction of the first substrate, the second substrate, and the third substrate and are electrically insulated from each other with gaps therebetween.

9. The solar cell according to claim 2, wherein the first electron transport layer and the first hole transport layer are formed of respective inorganic materials.

10. The solar cell according to claim 5, wherein the second electron transport layer and the second hole transport layer are formed of respective inorganic materials.

11. The solar cell according to claim 1, wherein the first photoelectric conversion layer contains a perovskite material.

12. The solar cell according to claim 1, wherein one of the pair of electrodes is a positive electrode and the other of the pair of electrodes is a negative electrode.

\* \* \* \* \*